(12) United States Patent
Yamazaki et al.

(10) Patent No.: US 6,590,230 B1
(45) Date of Patent: Jul. 8, 2003

(54) SEMICONDUCTOR DEVICE AND MANUFACTURING METHOD THEREOF

(75) Inventors: Shunpei Yamazaki, Tokyo (JP); Hisashi Ohtani, Kanagawa (JP); Jun Koyama, Kanagawa (JP); Takeshi Fukunaga, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 08/951,193

(22) Filed: Oct. 15, 1997

(30) Foreign Application Priority Data

Oct. 15, 1996 (JP) ................................. 8-294418
Oct. 24, 1996 (JP) ................................. 8-301249

(51) Int. Cl.$^7$ .......................................... H01L 29/786
(52) U.S. Cl. ........................................ 257/72; 257/66
(58) Field of Search ............................ 257/72, 66

(56) References Cited

U.S. PATENT DOCUMENTS

| | | | |
|---|---|---|---|
| 4,454,524 A | 6/1984 | Spence | |
| 4,549,336 A | 10/1985 | Sheppard | |
| 4,697,198 A | 9/1987 | Komori et al. | |
| 4,959,697 A | 9/1990 | Shier et al. | |
| 4,999,682 A | 3/1991 | Xu et al. | |
| 5,196,367 A | 3/1993 | Lu et al. | |
| 5,198,879 A | 3/1993 | Ohshima | |
| 5,210,437 A | 5/1993 | Sawada et al. | 257/392 |
| 5,324,960 A | 6/1994 | Pfiester et al. | |
| 5,343,051 A | 8/1994 | Yamaguchi et al. | |
| 5,350,940 A | 9/1994 | Rona | |
| 5,426,325 A | 6/1995 | Chang et al. | |
| 5,428,234 A | 6/1995 | Sumi | |
| 5,449,937 A | 9/1995 | Arimura et al. | |
| 5,481,121 A | * 1/1996 | Zhang | 257/72 |
| 5,529,937 A | 6/1996 | Zhang et al. | |
| 5,532,175 A | 7/1996 | Racanelli et al. | |
| 5,548,143 A | 8/1996 | Lee | |
| 5,606,191 A | 2/1997 | Wang | |
| 5,608,231 A | 3/1997 | Ugajin et al. | |
| 5,608,232 A | 3/1997 | Yamazaki et al. | |
| 5,614,752 A | 3/1997 | Takenaka | |
| 5,619,053 A | 4/1997 | Iwamatsu et al. | |
| 5,635,749 A | 6/1997 | Hong | |
| 5,639,698 A | 6/1997 | Yamazaki et al. | |
| 5,661,059 A | 8/1997 | Liu et al. | |

(List continued on next page.)

FOREIGN PATENT DOCUMENTS

| | | |
|---|---|---|
| JP | 61-256769 | 11/1986 |
| JP | 02-31464 | 2/1990 |
| JP | 02-159070 | 6/1990 |
| JP | 02-196468 | 8/1990 |
| JP | 02-203566 | 8/1990 |
| JP | 04-206971 | 7/1992 |
| JP | 04-286339 | 10/1992 |
| JP | 05-283687 | 10/1993 |
| JP | 06-244103 | 9/1994 |
| JP | 07-135318 | 5/1995 |
| JP | 07-321339 | 12/1995 |
| WO | WO 88/03328 A1 | 5/1988 |

OTHER PUBLICATIONS

Kwok K. Ng, Complete Guide to Semiconductor Devices, 1995, McGraw–Hill, Inc.

*Primary Examiner*—Jerome Jackson
(74) *Attorney, Agent, or Firm*—Fish & Richardson P.C.

(57) ABSTRACT

An active layer is formed by using a crystalline silicon film that has been crystallized by utilizing a metal element for accelerating crystallization. A heat treatment is performed in an atmosphere containing a halogen element to remove the metal element by gettering. As a result, the active layer becomes a crystal structural body that is a collection of a plurality of needle-like or columnar crystals. A semiconductor device constructed by using this crystal structural body is given much superior performance.

60 Claims, 18 Drawing Sheets

U.S. PATENT DOCUMENTS

| | | |
|---|---|---|
| 5,670,389 A | 9/1997 | Huang et al. |
| 5,674,788 A | 10/1997 | Wristers et al. |
| 5,675,164 A | 10/1997 | Brunner et al. |
| 5,698,884 A | 12/1997 | Dennen |
| 5,700,333 A | 12/1997 | Yamazaki et al. |
| 5,731,612 A | 3/1998 | Buxo et al. |
| 5,744,824 A * | 4/1998 | Kousai .................. 257/72 |
| 5,773,327 A | 6/1998 | Yamazaki et al. |
| 5,786,618 A | 7/1998 | Wen |
| 5,789,284 A | 8/1998 | Yamazaki et al. |
| 5,801,416 A | 9/1998 | Choi et al. |
| 5,814,540 A | 9/1998 | Takemura et al. |
| 5,821,138 A * | 10/1998 | Yamazaki ............... 257/72 |
| 5,831,294 A | 11/1998 | Ugajin |
| 5,869,363 A | 2/1999 | Yamazaki et al. |
| 5,885,872 A | 3/1999 | Tamaki et al. |
| 5,888,858 A | 3/1999 | Yamazaki et al. |
| 5,893,730 A | 4/1999 | Yamazaki et al. |
| 5,893,740 A | 4/1999 | Chang et al. |
| 5,894,137 A | 4/1999 | Yamazaki et al. |
| 5,894,151 A | 4/1999 | Yamazaki et al. |
| 5,897,347 A | 4/1999 | Yamazaki et al. |
| 5,905,291 A | 5/1999 | Utsunomiya et al. |
| 5,915,174 A | 6/1999 | Yamazaki et al. |
| 5,949,115 A | 9/1999 | Yamazaki et al. |
| 5,952,699 A | 9/1999 | Yamazaki et al. |
| 5,956,579 A | 9/1999 | Yamazaki et al. |
| 5,961,743 A | 10/1999 | Yamazaki et al. |
| 5,977,559 A | 11/1999 | Zhang et al. |
| 5,985,740 A | 11/1999 | Yamazaki et al. |
| 6,027,987 A | 2/2000 | Yamazaki et al. |
| 6,048,758 A | 4/2000 | Yamazaki et al. |
| 6,063,654 A | 5/2000 | Ohtani |
| 6,066,518 A | 5/2000 | Yamazaki |
| 6,071,764 A | 6/2000 | Zhang et al. |
| 6,071,766 A | 6/2000 | Yamazaki et al. |
| 6,072,193 A | 6/2000 | Ohnuma et al. |
| 6,077,731 A | 6/2000 | Yamazaki et al. |
| 6,077,758 A | 6/2000 | Zhang et al. |
| 6,084,247 A | 7/2000 | Yamazaki et al. |
| 6,093,934 A | 7/2000 | Yamazaki et al. |
| 6,107,654 A | 8/2000 | Yamazaki |
| 6,111,296 A | 8/2000 | Yamazaki et al. |
| 6,118,148 A | 9/2000 | Yamazaki |
| 6,127,702 A | 10/2000 | Yamazaki et al. |
| 6,184,556 B1 | 2/2001 | Yamazaki et al. |
| 6,198,141 B1 | 3/2001 | Yamazaki et al. |
| 6,218,714 B1 | 4/2001 | Yamazaki |
| 6,232,642 B1 | 5/2001 | Yamazaki |
| 6,251,733 B1 | 6/2001 | Yamazaki |
| 6,307,220 B1 | 10/2001 | Yamazaki |

* cited by examiner

HEAT TREATMENT IN AN ATMOSPHERE INCLUDING HALOGEN $\overline{150\mu m}$ $\overline{150\mu m}$ RING OSCILLATORS FREQUENCY [MHz]

| POWER SUPPLY VOLTAGE [V] | NUMBER OF STAGES | | |
|---|---|---|---|
| | 9 STAGES | 19 STAGES | 51 STAGES |
| 1.0 | | 30 | 10 |
| 1.5 | 133 | 68 | 24 |
| 2.0 | 195 | 101 | 37 |
| 2.5 | 245 | 131 | 48 |
| 3.0 | 286 | 156 | 58 |
| 3.3 | 307 | 168 | 63 |
| 3.5 | 328 | 176 | 66 |
| 4.0 | 351 | 198 | 73 |
| 4.5 | 377 | 206 | 79 |
| 5.0 | 402 | 226 | 85 |

POWER SUPPLY VOLTAGE 3.3V

OSCILLATION FREQUENCY 454.37 MHz

OSCILLATION FREQUENCY 539.51 MHz

SEMICONDUCTOR DEVICE AND MANUFACTURING METHOD THEREOF

BACKGROUND OF THE INVENTION

1. Field of the Invention

The present invention relates to a semiconductor device that uses, as an active layer, a semiconductor thin film formed on a base member having an insulating surface and, more specifically, to a thin-film transistor that uses a crystalline silicon film as an active layer.

2. Description of the Related Art

In recent years, the technology for forming a thin-film transistor (TFT) by using a semiconductor thin film (thickness: hundreds to thousands of angstrom) that is formed on a base member having an insulating substrate attract much attention. The thin-film transistor is widely applied to electronic devices such as ICs and electro-optical devices and, in particular, is now being developed rapidly as an switching element of image display devices.

For example, in a liquid crystal display device, it is attempted to apply TFTs to every electric circuit such as a pixel matrix circuit for controlling individual pixel regions that are arranged in matrix form, a driver circuit for controlling the pixel matrix circuit, or a logic circuit (a processor circuit, a memory circuit, or the like) for processing external data signals.

At present, TFTs have been put into practical use that use an amorphous silicon film as an active layer. However, TFTs that use a crystalline silicon film (polysilicon film) are needed for electric circuits that are required to operate even faster, such as a driver circuit and a logic circuit.

The technique disclosed in Japanese Unexamined Patent Publication Nos. Hei. 6-232059 and Hei. 6-244103 is known as a method for forming a crystalline silicon film on a base member. These technique enables formation of a crystalline silicon film that is superior in crystallinity through a heat treatment of 500°–600° C. and about 4 hours by utilizing a metal element (particularly nickel) for accelerating crystallization of silicon.

However, even if a driver circuit is constructed by using such TFTs, it does not completely satisfy the required performance. In particular, it, is still impossible to construct, by conventional TFTs, high-speed logic circuits in which extremely high electrical performance is required to realize high-speed operation and a high breakdown voltage characteristic at the same time.

SUMMARY OF THE INVENTION

Accordingly, to improve the performance of electro-optical devices etc., it is necessary to realize a TFT whose performance is equivalent to that of a MOSFET formed by using a single crystal silicon wafer.

An object of the invention is therefore to provide a thin-film semiconductor device having extremely high performance and a manufacturing method thereof as an breakthrough for enabling further improvement of the performance of electro-optical devices.

As for the reason why the conventional method cannot provide a high-performance TFT as mentioned above, it is considered carriers (electrons or holes) are captured at grain boundaries and, as a result, the field-effect mobility that is one of the parameters indicating the TFT characteristics is prevented from being increased.

For example, dangling bonds of silicon atoms and defect (trap) states exist in a large number at grain boundaries. Carriers traveling through the inside of each crystal are easily trapped by dangling bonds, defect states, or the like when they approach or contact the grain boundaries. Therefore, it is considered that the grain boundaries behave as "malignant grain boundaries" that obstruct carrier movement.

To realize a high-performance semiconductor device as mentioned above, a technique is indispensable that changes the structure of "malignant grain boundaries" to convert them into "benign grain boundaries" for carriers. That is, it can be said that it is important to form grain boundaries at least having a low possibility of capturing carriers, that is, a low possibility of obstructing carrier movement.

Accordingly, the invention provides a manufacturing method of a semiconductor device having an active layer that is a semiconductor thin film, comprising the steps of forming an amorphous silicon film on a base member having an insulating surface; holding a metal element for accelerating crystallization in a given positional relationship with the amorphous silicon film; converting the amorphous silicon film into a crystalline silicon film by a first heat treatment; patterning the crystalline silicon film into an active layer; forming a gate insulating film on the active layer; performing a second heat treatment in an atmosphere containing a halogen element, to thereby remove the metal element from the active layer by gettering and to form a thermal oxidation film at an interface between the active layer and the gate insulating film; and performing a third heat treatment in a nitrogen atmosphere, to thereby improve a film quality and an interface state of the gate insulating film including the thermal oxidation film, wherein grain boundaries in the active layer have directivity and the active layer is a collection of a plurality of needle-like or columnar crystals extending generally parallel with the base member.

If a crystalline silicon film is formed according to the above manufacturing method, a thin film is formed that has an appearance as shown in FIG. 13, which is a microscope photograph of a crystalline silicon film as enlarged. As seen from FIG. 13, the crystalline silicon film is a collection of a plurality of crystal grains having as large diameters as tens of micrometers to a little larger than 100 μm. This manufacturing method utilizes, as a means for crystallizing an amorphous silicon film, the technique disclosed in Japanese Unexamined Patent Publication No. Hei. 6-232059.

FIG. 14 is a TEM photograph of a minute region as enlarged of the inside of a crystal grain, which was taken to scrutinize the inside of individual crystal grains shown in FIG. 13.

That is, the crystalline silicon film according to the invention macroscopically appears like a collection of large grains as shown in FIG. 13, actually its inside is a crystal structural body as a collection of a plurality of needle-like or columnar crystals 1401 as shown in FIG. 14.

In FIG. 14, reference numeral 1402 denotes grain boundaries, i.e., boundaries between the needle-like or columnar crystals 1401. It is seen from the extending direction of the grain boundaries 1402 that the needle-like or columnar crystals 1401 grew generally parallel with each other. In this specification, the term "grain boundaries" means boundaries between needle-like or columnar crystals unless otherwise specified.

In the active layer of the semiconductor device according to the invention, the metal element (principal example: nickel) for accelerating crystallization is gettering-removed by the heat treatment in the atmosphere containing a halogen element, so that the metal element that previously remained at a concentration higher than $1\times10^{18}$ atoms/cm$^3$ is reduced to lower than or equal to $1\times10^{18}$ atoms/cm$^3$, typically $1\times10^{14}$ to $5\times10^{17}$ atoms/cm$^3$ (preferably lower than the spin density). Moreover, the phosphorous gettering method may be used for reducing the concentration of metal element in the semiconductor layer. The technique disclosed in U.S. patent publication Ser. No. 08/623,336 and Japanese Unexamined Patent Publication Hei. 8-340127 by Yamazaki et al. is known as a method for removing the metal element from the crystalline silicon.

It is naturally considered that other metal elements such as Cu, Al, etc. that were introduced by contamination or the like (that is, not introduced intentionally) are also removed by gettering.

At this time, it is expected that dangling bonds of silicon atoms connect to oxygen atoms during the heat treatment, to form the oxide (silicon oxide). It is considered that, as a result, silicon oxide is formed in the regions that were previously "malignant grain boundaries" and substantially functions as grain boundaries.

It is presumed that the thus-formed grain boundaries 1402 are such that interfaces between silicon oxide and crystal silicon include almost no lattice defects, and hence are superior in matching performance. This is because interstitial silicon atoms that would otherwise cause defects are consumed by synergism of a process that silicon oxide is formed by thermal oxidation and a process that recombination between silicon atoms themselves or a silicon atom and an oxygen atom is accelerated by the catalytic effect of nickel.

That is, it is considered that the grain boundaries 1402 in FIG. 14 has almost no carrier-capturing defects and behave as "benign grain boundaries" that function merely as energy barriers for carriers that move through the inside of the needle-like or columnar crystals 1401.

Since thermal oxidation reaction proceeds with preference in such grain boundaries, a thermal oxidation film that is formed there becomes thicker than in the other regions. Therefore, a gate voltage applied to the vicinities of the grain boundaries is apparently reduced, which also functions as energy barriers.

Since the heat treatment is performed at a relatively high temperature that is higher than 700° C. (typically 800°–1, 100° C.), such crystal defects as dislocations and stacking faults that existed inside the needle-like or columnar crystals mostly disappear. Further, residual dangling bonds of silicon atoms are terminated by hydrogen atoms and halogen atoms contained in the film.

Thus, in the state of FIG. 14 that is obtained in the above manner, the inventors define the regions inside the plurality of needle-like or columnar crystals 1401 as "regions that can substantially be regarded as a single crystal for carriers."

"Being substantially regarded as a single crystal for carriers" means that there are no barriers that obstruct carrier movement, and can also be expressed as "there are no crystal defects or grain boundaries" or "there are no potential barriers serving as energy barriers."

The invention is intended to form the active layer of a semiconductor device as typified by a TFT by utilizing the crystalline silicon film having the above structure, thereby realizing a high-performance semiconductor device suitable to construct a driver circuit and a logic circuit.

The invention as summarized above will be hereinafter described in detail in the form of various embodiments.

DETAILED DESCRIPTION OF THE PREFERRED EMBODIMENTS

Embodiment 1

A first embodiment is directed to a case where a crystalline silicon film that is formed according to a manufacturing method of the invention is used as an active layer of a thin-film transistor (TFT). FIGS. 1A–1D and 2A–2C show a manufacturing process of a TFT according to this embodiment.

In this embodiment, the technique disclosed in Japanese Unexamined Patent Publication Nos. Hei. 6-232059 and Hei. 6-244103 is used as a means for crystallizing an amorphous silicon film. This technique will be described only briefly in this embodiment. For details, refer to the above publications.

First, a base member 101 having an insulating surface is prepared. In this embodiment, a 2,000-Å-thick silicon oxide film 102 as an underlayer film is formed on a quartz substrate by low-pressure thermal CVD, plasma CVD, sputtering, or the like. Also, an alumina glass substrate having a heat resistance against 1,000° C. or more can be used as the base member.

It is noted that studies of the present inventors have revealed that in crystallizing an amorphous silicon film in a later step a resulting crystalline silicon film will exhibit better crystallinity when the underlayer film is dense. Further, it is preferable that the underlayer film contain oxygen at $5\times10^{17}$ to $2\times10^{19}$ atoms/cm$^3$. Oxygen contained in the underlayer film will play an important role in a later step of gettering a metal element for accelerating crystallization.

Then, an amorphous silicon film 103 of 200–1,000 Å in thickness (in this embodiment, 350 Å) by low-pressure thermal CVD by using a silane type film formation gas ($SiH_4$, $Si_2H_6$, $Si_3H_8$, or the like). In an amorphous silicon film formed by low-pressure thermal CVD, the rate of occurrence of natural nuclei is low during a crystallization step. This is desirable in increasing the size of crystal grains because of a reduced rate of interference between individual crystals (collision between crystals stops crystal growth).

Naturally, the amorphous silicon film 103 may be formed by plasma CVD, sputtering, or some other proper method.

After the formation of the amorphous silicon film 103, it is irradiated with UV light to form a very thin oxide film (not shown) on the surface of the amorphous silicon film 103. The oxide film is to improve the wettability of a solution that will be used in a later solution applying step for introducing a metal element for accelerating crystallization.

In general, the metal element for accelerating crystallization is one or plurality of elements selected from Fe, Co, Ni, Ru, Rh, Pd, Os, Ir, Pt, Cu, and Au. This embodiment is directed to a case of using Ni (nickel).

Figure 1A:
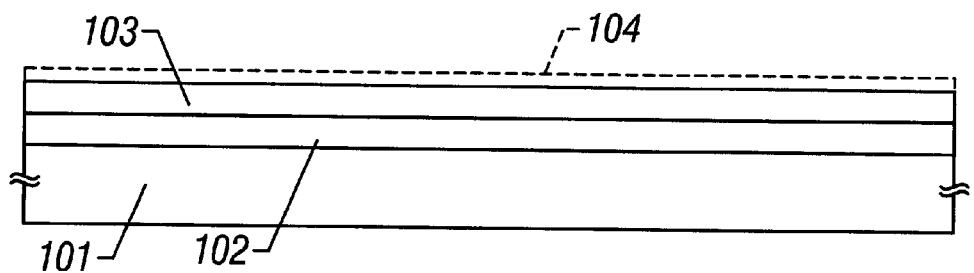
FIGS. 1A–1D and 2A–2C show a manufacturing process of a TFT according to a first embodiment of the present invention.
Figure 1B:
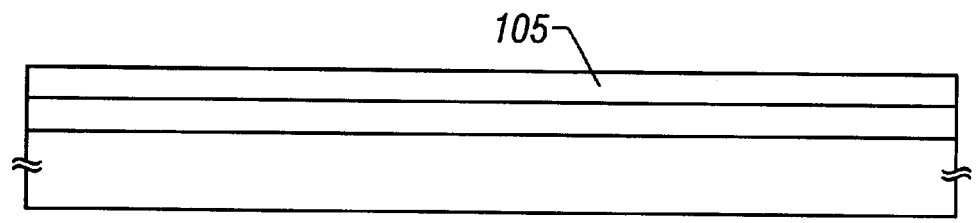

Then, a nickel nitrate salt (or nickel acetate salt) solution containing nickel at a given concentration (in this embodiment, 10 ppm in terms of weight) is dropped, and a film water film 104 containing nickel is formed by spin coating (see FIG. 1A). The concentration of nickel added to the amorphous silicon film 103 can easily be controlled by adjusting the density of the nickel salt solution in the solution applying step.

As seen from the above description, the technique disclosed in the Japanese Unexamined Patent publications Hei. 6-232059 and Hei. 6-244103 is advantageous in that the number of steps is small and the process is simple, which means high throughput and a high production yield.

Then, after dehydrogenation is performed at 450° C. for about one hour in an inactive atmosphere, the amorphous silicon film 103 is crystallized by performing a heat treatment (first heat treatment) at 500°–700° C. (typically 550°–600° C.) for 4–8 hours. Thus, crystalline silicon film 105 is obtained (see FIG. 1B).

Laser annealing with an excimer laser may be performed on the crystalline silicon film 105 before and/or after a later heat treatment in an atmosphere containing a halogen element. Although the laser irradiation can improve the crystallinity of the crystalline silicon film 105, it likely causes asperity on its surface. Care should be taken so as to avoid such an phenomenon.

Thereafter, the resulting crystalline silicon film 105 is patterned into an active layer 106 that will function as an active layer of a TFT.

After the formation of the active layer 106, a silicon oxide film of 200–1,500 Å (in this embodiment, 300 Å) in thickness as a gate insulating film 107 is formed on the active layer 106 by a vapor-phase method such as plasma CVD, thermal CVD or sputtering Instead of a silicon oxide film, a silicon nitride film, a silicon oxynitride film, or a laminate layer of these insulating films may be used.

Figure 1C:
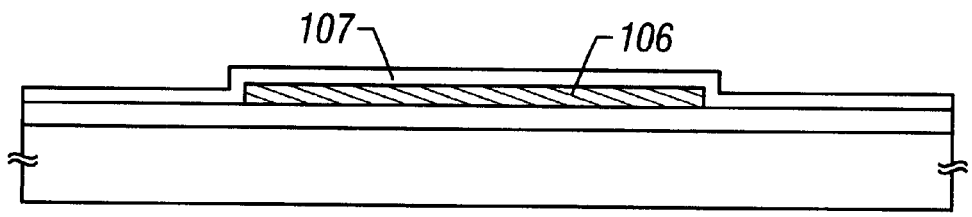

Next, a heat treatment (second heat treatment) is performed in an atmosphere containing a halogen element (see FIG. 1C). This is mainly intended for removal of metal elements (particularly nickel) from the active layer 106 by utilizing a metal element gettering effect of the halogen element.

It is important that the heat treatment for gettering be performed at a temperature higher than 700° C. to make it effective. At a temperature of 700° C. or less, there arises a possibility that a sufficient gettering effect is not obtained because of the gate insulating film 107 serving as a blocking layer.

Thus, the heat treatment is performed at a temperature higher than 700° C., preferably in a range of 800°–1,000° C. (typically at 950° C.). The processing time is set at 0.1–6 hours, typically 0.5–1 hour.

In this embodiment, the heat treatment is performed at 950° C. for 30 minutes in an atmosphere in which hydrogen chloride (HCl) is contained at 3 wt % (0.5–10 wt %) with respect to oxygen ($O_2$). A HCl concentration higher than the above range is not preferable because under such a condition asperity equivalent to the thickness of the crystalline silicon film would be formed on its surface.

Although in this embodiment HCl (gas) is used as a compound containing a halogen element, one or a plurality of compounds (gases) selected from such halogen-including compounds as HF, $NF_3$, HBr, $Cl_2$, $ClF_3$, $BCl_3$, $F_2$, and $Br_2$ may also be used. In general, a halogen hydride or an organic material including a halogen element (halogen carbohydrate) may also be used for the same purpose.

It is considered that in this step nickel that is segregated at grain boundaries of needle-like or columnar crystals are gettered by action of a halogen element (chlorine in this case) and removed to the air in the form of nickel chloride which is volatile.

Figure 3:
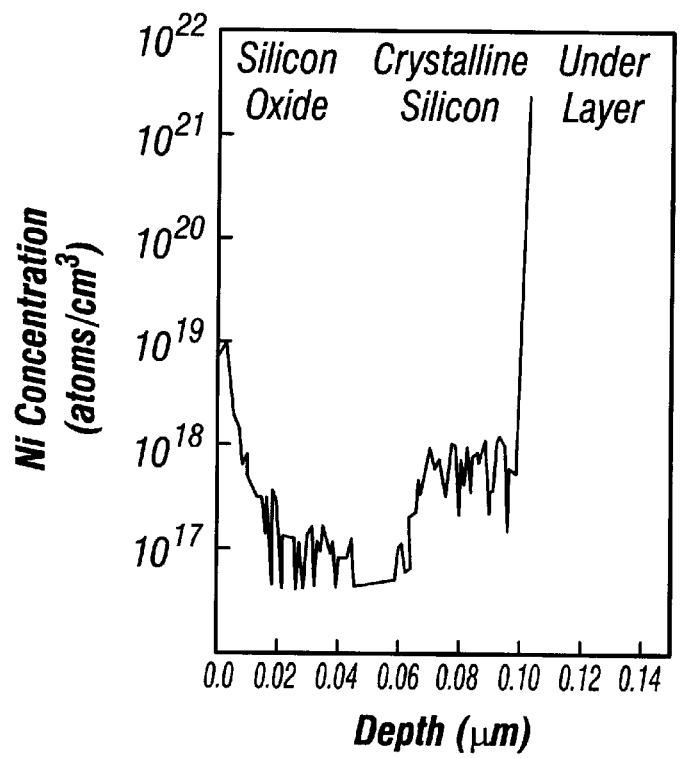
FIGS. 3 and 4 show nickel concentration profiles in an active layer and its vicinity.

FIG. 3 shows a concentration profile, obtained by a SIMS analysis, of nickel contained in a crystalline silicon film in a case where the gettering by a halogen element was not performed. As seen from FIG. 3, nickel remains in the film at concentrations of about $1 \times 10^{18}$ atoms/cm³ at the maximum and $5 \times 10^{17}$ atoms/cm³ at the minimum.

Figure 4:
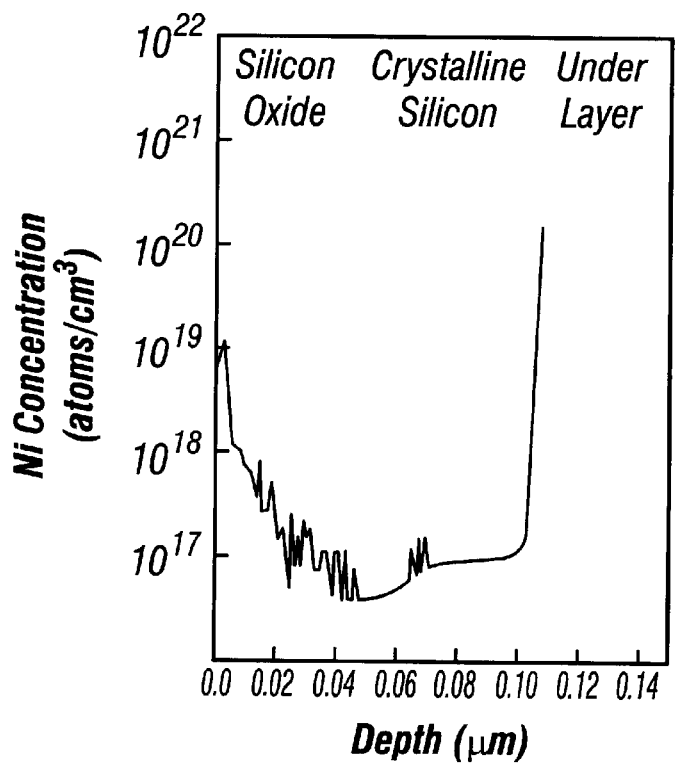

FIG. 4 shows a concentration profile, obtained by a SIMS analysis, of nickel contained in a crystalline silicon film in a case where the gettering by a halogen element, which is an important feature of the invention, was performed. As seen from FIG. 4, the SIMS analysis indicates that the nickel concentration of the crystalline silicon film is reduced to less than $1 \times 10^{18}$ atoms/cm³ and even to less than $5 \times 10^{17}$ atoms/cm³ which is the minimum level in FIG. 3.

The lower limit of detection of the SIMS is about $1 \times 10^{16}$ atoms/cm³. However, based on characteristics (described later) of TFTs according to the invention, it is considered that the nickel concentration is reduced to less than the spin density ($1 \times 10^{15}$ to $1 \times 10^{16}$ cm⁻³) of the active layer 106, i.e., to about $1 \times 10^{14}$ atoms/cm³.

That is, by virtue of the gettering the nickel concentration of the active layer 106 is reduced to less than or equal to $1 \times 10^{18}$ atoms/cm³, typically $1 \times 10^{14}$ to $5 \times 10^{17}$ atoms/cm³, at which nickel does not affects the device characteristics.

Figure 5:
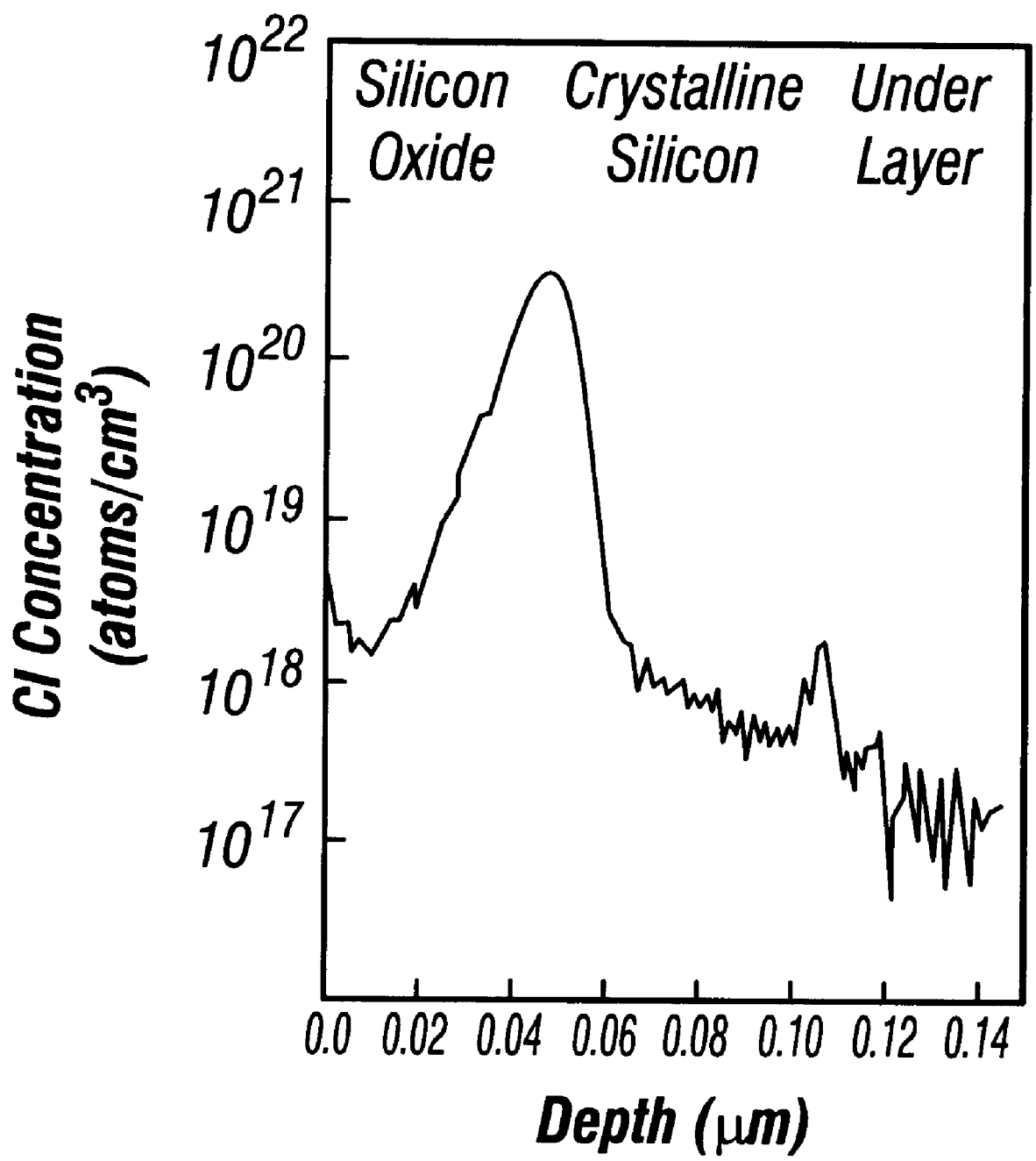
FIG. 5 shown a chlorine concentration profile in an active layer and its vicinity.

According to the knowledge of the inventors, nickel that has been utilized to accelerate crystallization tends to segregate at grain boundaries of needle-like or columnar crystals at a high probability and substantially no nickel is contained inside the needle-like or columnar crystals. However, since a current SIMS analysis detects information of both of the inside of crystals and grain boundaries, strictly speaking a nickel concentration value appearing in this specification means an average of a nickel concentration of the inside of crystals and that of grain boundaries.

Where the gettering step is executed, a halogen element that has been used for the gettering remains in the crystalline silicon film at a concentration of $1 \times 10^{15}$ to $1 \times 10^{20}$ atoms/cm³. The halogen element tends to exist at a high concentration between the crystalline silicon film and the thermal oxidation film, as shown in FIG. 5. FIG. 5 shows a result of an examination, by a SIMS analysis, of the interfaces of the active layer 106 of a TFT that was manufactured according to this embodiment. It is seen from FIG. 5 that chlorine exists at a high concentration between the thermal oxidation film (silicon oxide film) and the crystalline silicon film.

It is considered that during nickel segregates so as to be forced to go out to the grain boundaries of needle-like or columnar crystals during the crystallization and exists in the form of nickel silicide. Nickel escapes as nickel chloride during the gettering. As a result of disconnections of silicon atoms from nickel atoms, there occur many dangling bonds of silicon atoms at grain boundaries.

However, since the above step is executed at a relatively high temperature in an oxidizing atmosphere, the dangling bonds thus formed would easily connect to oxygen atoms to form oxides (silicon oxides represented by $SiO_x$). That is, the inventors consider that as a result of the above series of heat treatment steps the crystalline silicon film turns to a crystal structural body in which silicon oxides serve as crystal boundaries.

Residual dangling bonds are terminated by hydrogen atoms and halogen atoms contained in the active layer 106 or compensated for through recombination of silicon atoms themselves, and crystal defects such as a dislocation and a stacking fault almost disappear through recombination and rearrangement of silicon atoms. Therefore, the crystallinity inside needle-like or columnar crystals would be improved considerably.

In summary, as a result of the heat treatment in an halogen atmosphere, the active layer 106 turns to a crystal structural body having regions in which nickel has been removed sufficiently to such an extent as not to impair the device characteristics (even preferably to less than the spin density of the active layer 106), and needle-like or columnar crystals that constitute the active layer 106 have been improved considerably in crystallinity and hence can substantially be regarded as single crystals for carriers.

As a result of the above heat treatment, a thermal oxidation reaction proceeds at the interface between the active layer 106 and the gate insulating film 107, so that a 200-Å-thick thermal oxidation film is formed by oxidation of a silicon film of about 100 Å in thickness. That is, the total thickness of the gate insulating film 107, i.e., the film formed by CVD plus the thermal oxidation film, becomes 500 Å.

By performing a further heat treatment at 950° C. for about one hour in a nitrogen atmosphere after the above-described heat treatment in a halogen atmosphere, the film quality of the gate insulating film 107 is improved and a very good semiconductor/insulating film interface is obtained.

By the way, the active layer 106 is formed by dry etching, and if plasma damage that is produced at the edges of the active layer 106 were left as it is, it would possibly cause leak current in resulting TFT. In this embodiment, plasma damage is eliminated when the edges of the active layer 106 are thermally oxidized.

After the formation of the gate insulating film 107, a 2,500-Å-thick aluminum film (not shown) for formation of a gate electrode is formed by sputtering. Scandium is added to the aluminum film at 0.2 wt % to prevent occurrence of hillocks and whiskers.

Although in this embodiment the material mainly made of aluminum is used to form a gate electrode (and a gate interconnection), tungsten, tantalum, molybdenum, and the like may also be used. As a further alternative, a crystalline silicon film that is rendered conductive may be used as a gate electrode.

Figure 1D:
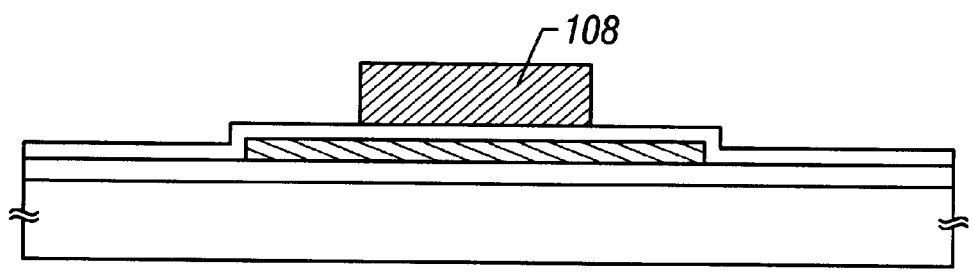

Then, as shown in FIG. 1D, the aluminum film is patterned into an island-like aluminum film pattern 108 as a starting pattern of the gate electrode. A resist mask (not shown) that was used in this step is left as it is.

In this state, anodization is performed with the aluminum film pattern 108 used as the anode according to a known anodization technique (refer to Japanese Unexamined Patent Publication No. Hei. 7-135318, for instance). As a result of this anodization step, a porous anodic oxide film 109 is formed on the side faces of the pattern 108, at a thickness of 0.7 μm in this embodiment.

Figure 2A:
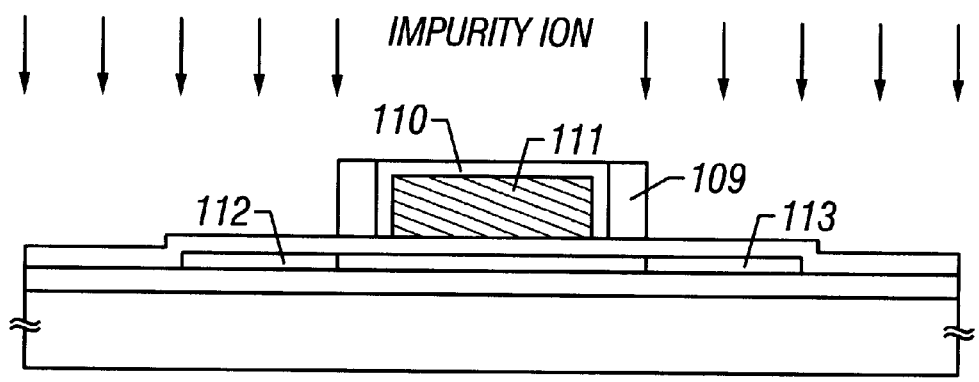

After the formation of the porous anodic oxide film 109 as shown in FIG. 2A, the resist film (not shown) is removed. A 900-Å-thick, dense anodic oxide film 110 is then formed by again performing anodization.

A gate electrode 111 is defined through the above steps. The dense anodic oxide film 110 serves to protect the gate electrode 111 and prevent occurrence of hillocks and whiskers in later steps.

After the formation of the dense anodic oxide film 110, impurity ions are implanted to form source and drain regions. P (phosphorus) may be implanted to manufacture an n-channel TFT and B (boron) may be implanted to manufacture a p-channel TFT. As a result, a source region 112 and a drain region 113 are formed which are doped with an impurity at a high concentration.

Figure 2B:
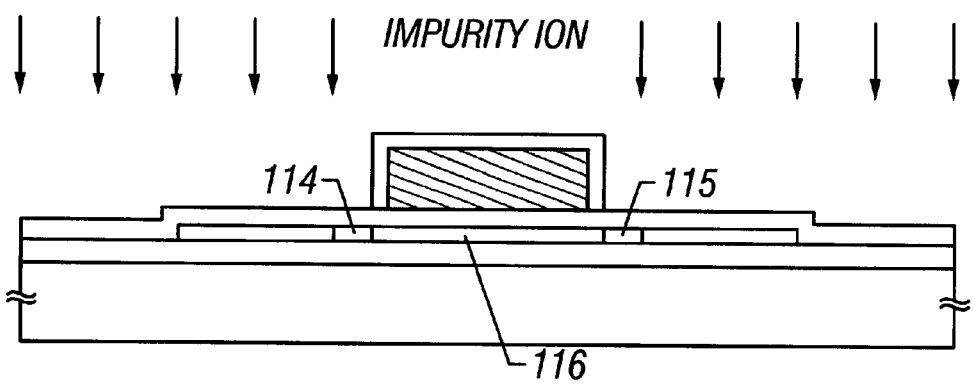

Then, after only the porous anodic oxide film 109 is removed with a mixed acid of acetic acid, phosphoric acid, and nitric acid, P ions are again implanted at a lower dose than in the above step of forming the source and drain regions 112 and 113 (see FIG. 2B).

As a result, low-concentration impurity regions 114 and 115 having a lower impurity concentration than the source and drain regions 112 and 113 are formed. A region 116 right under the gate electrode 111 becomes a channel forming region in a self-aligned manner.

The low-concentration impurity region 115 between the channel forming region 116 and the drain region 113, which is particularly called "LDD (lightly doped drain) region," has an effect of weakening a strong electric field that is formed between the channel forming region 116 and the drain region 113.

The channel forming region 116 (strictly speaking, the inside of needle-like or columnar crystals) is intrinsic or substantially intrinsic. The "intrinsic or substantially intrinsic region" means a region where the activation energy is about ½ of the band gap (that is, the Fermi level is located at the center of the forbidden band) and the impurity concentration is lower than the spin density, or an undoped region that is not doped intentionally with any impurity such as P or B.

After the above step of implanting impurity ions, irradiation with laser light, infrared light, or ultraviolet light is performed to anneal the regions where impurity ions were implanted. As a result, the added ions are activated and damage that was caused in the active layer during the ion implantation is repaired.

It is effective to perform a hydrogenation treatment in a temperature range of 300°–350° C. for 0.5–1 hour. This step is to again hydrogen-terminate dangling bonds that were generated by hydrogen desorption from the active layer. This step adds hydrogen to the active layer at a concentration of less than or equal to $1\times10^{21}$ atoms/cm$^3$, preferably $1\times10^{15}$ to $1\times10^{21}$ atoms/cm$^3$.

Figure 2C:
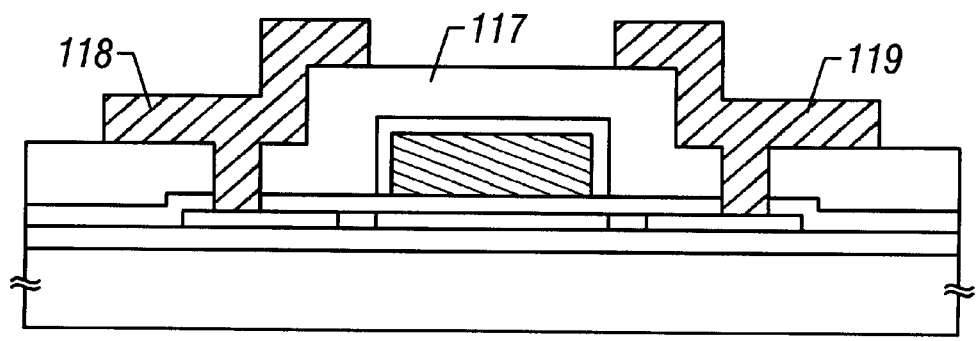

After the state of FIG. 2B is obtained in the above manner, an interlayer insulating film 117 is formed by using a silicon oxide film, a silicon nitride film, a silicon oxynitride film, or an organic resin film, or a multi-layer film thereof (see FIG. 2C).

Where a polyimide film is used which is an organic resin film, a parasitic capacitance between interconnections that are arranged in the vertical direction can be reduced because of its small relative dielectric constant. Further, since a polyimide film can be formed by spin coating, the film thickness can be increased easily, resulting in an increase in throughput.

Thereafter, after contact holes are formed through the interlayer insulating film 117, a source electrode 118 and a drain electrode 119 are formed. Then, the entire device is hydrogenated by performing a heat treatment at 350° C. in a hydrogen atmosphere. Thus, a TFT shown in FIG. 2C is completed.

Although FIG. 2C shows the TFT having the simplest structure for convenience of description, a desired TFT structure can easily be obtained when necessary by making a small modification or addition to the manufacturing process of this embodiment.

Figure 6A:
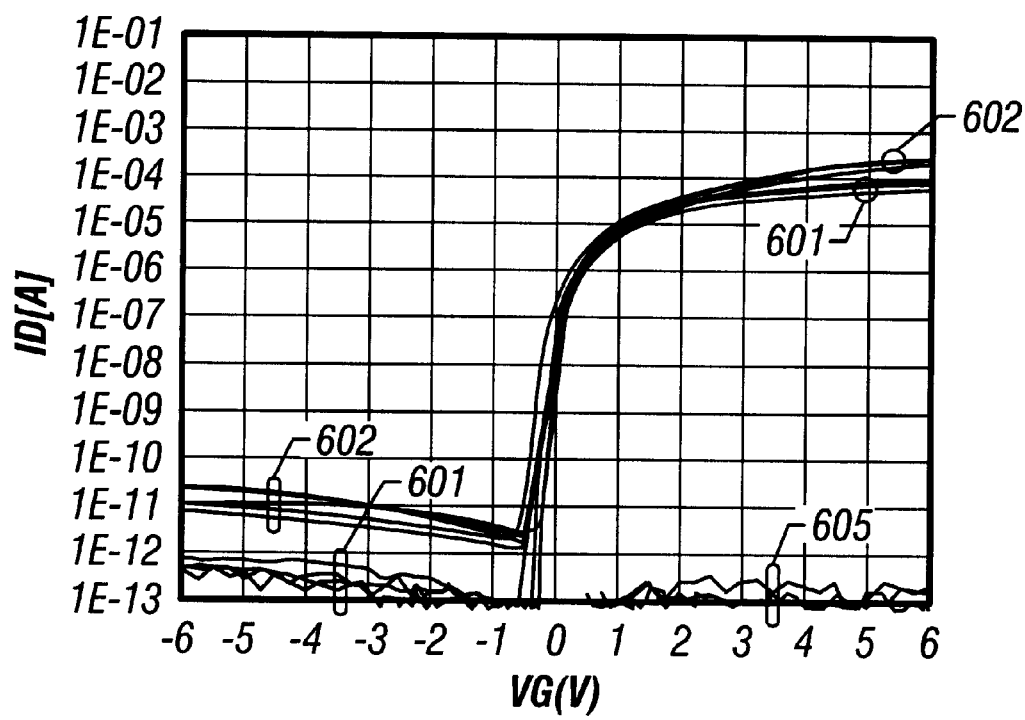
FIGS. 6A and 6B show electrical characteristics of TFTs.
Figure 6B:
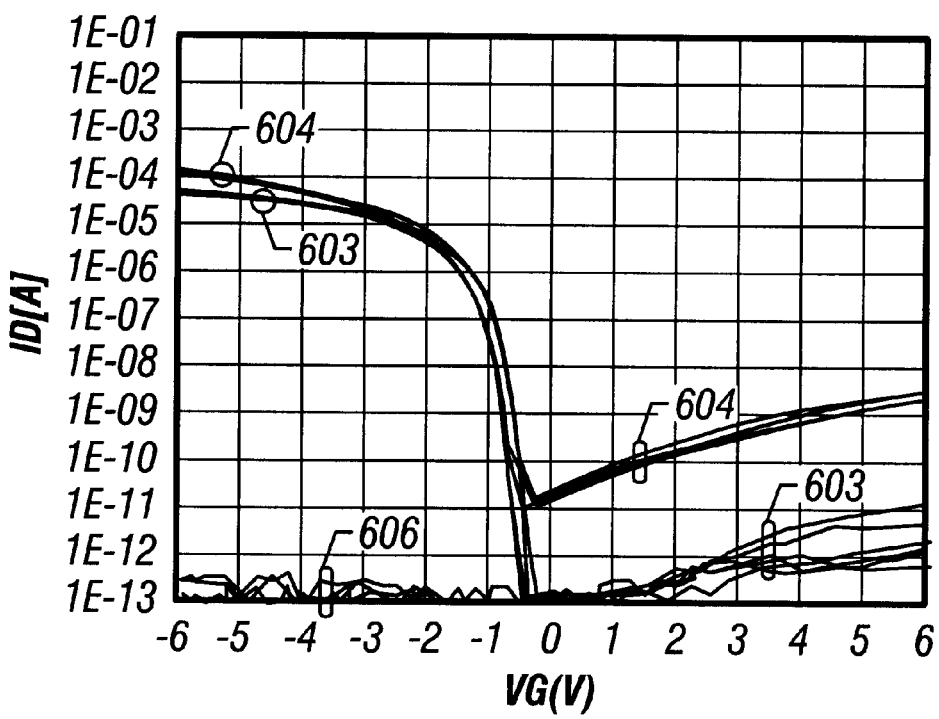

FIGS. 6A and 6B show electrical characteristics of semiconductor devices of FIG. 2C manufactured by the inventors according to the embodiment. FIG. 6A shows an electrical characteristic (Id–Vg characteristic) of an n-channel TFT and FIG. 6B shows an electrical characteristic of a p-channel TFT. Each graph of the Id–Vg characteristic shows measurement results of five points provided on the same substrate together.

The horizontal axis represents the gate voltage Vg and the vertical axis represents the current Id flowing between the source and the drain. Id–Vg curves 601 and 603 are characteristics that were obtained when the drain voltage Vd was equal to 1 V, and Id–Vg curves 602 and 604 are characteristics that were obtained when the drain voltage Vd was 5 V. Numerals 605 and 606 denote leak currents that were obtained when the drain voltage Vd was 1 V.

Drain currents Ioff in the off ranges (Vg is lower than −1 V in FIG. 6A and higher than −1 V in FIG. 6B) and leak currents Ig in both on and off ranges are mostly smaller than $1 \times 10^{-13}$ A (lower limit of detection), they are mixed with noise in FIGS. 6A and 6B.

Tables 1 and 2 show values of typical characteristic parameters of TFTs according to the invention which values were determined from the electrical characteristics- of FIGS. 6A and 6B. Table 1 shows measurement results of n-channel TFTs formed on the same substrate (at arbitrary 20 points) and Table 2 shows measurement results of p-channel TFTs formed on the same substrate (at arbitrary 20 points).

TABLE 1

| MEASURE-MENT POINTS | Ion_1[uA] (VD = 1 V) (VG = 5 V) | Ion_2[uA] (VD = 5 V) (VG = 5 V) | Ioff_1[uA] (VD = 1 V) (VG = 6 V) | Ioff_2[uA] (VD = 5 V) (VG = 1 V) | Ion/Ioff1 | Ion/Ioff2 | Vth[V] (VD = 5 V) |
|---|---|---|---|---|---|---|---|
| Point 1 | 106.07 | 330.63 | 0.68 | 2.46 | 8.19 | 8.13 | −0.58 |
| Point 2 | 110.65 | 328.89 | 0.71 | 1.21 | 8.19 | 8.43 | −0.38 |
| Point 3 | 104.23 | 321.93 | 0.92 | 6.98 | 8.05 | 7.66 | −0.54 |
| Point 4 | 110.74 | 342.70 | 0.45 | 1.92 | 8.39 | 8.25 | −0.58 |
| Point 5 | 92.83 | 291.00 | 0.58 | 1.45 | 8.20 | 8.30 | −0.44 |
| Point 6 | 111.50 | 345.87 | 0.28 | 2.24 | 8.60 | 8.19 | −0.55 |
| Point 7 | 98.77 | 317.28 | 0.83 | 2.17 | 8.08 | 8.16 | −0.57 |
| Point 8 | 99.16 | 315.82 | 0.27 | 0.86 | 8.56 | 8.56 | −0.56 |
| Point 9 | 96.34 | 315.41 | 1.03 | 1.62 | 7.97 | 8.29 | −0.45 |
| Point 10 | 100.39 | 320.20 | 0.92 | 4.70 | 8.04 | 7.83 | −0.60 |
| Point 11 | 107.68 | 337.04 | 1.05 | 3.85 | 8.01 | 7.94 | −0.56 |
| Point 12 | 130.49 | 388.87 | 0.40 | 1.61 | 8.51 | 8.38 | −0.51 |
| Point 13 | 110.53 | 332.17 | 1.07 | 1.14 | 8.01 | 8.46 | −0.41 |
| Point 14 | 123.34 | 359.87 | 1.30 | 1.27 | 7.98 | 8.45 | −0.33 |
| Point 15 | 104.55 | 312.87 | 0.30 | 1.22 | 8.54 | 8.41 | −0.32 |
| Point 16 | 97.18 | 303.28 | 0.77 | 1.31 | 8.10 | 8.36 | −0.54 |
| Point 17 | 98.89 | 299.66 | 0.42 | 2.08 | 8.37 | 8.16 | −0.36 |
| Point 18 | 102.90 | 324.42 | 0.73 | 0.29 | 8.15 | 9.05 | −0.54 |
| Point 19 | 96.08 | 307.26 | 0.63 | 2.74 | 8.18 | 8.05 | −0.55 |
| Point 20 | 115.54 | 348.82 | 1.10 | 1.54 | 8.02 | 8.38 | −0.40 |
| AVERAGE | 105.89 | 327.20 | 0.72 | 2.13 | 8.21 | 8.27 | −0.49 |
| STANDARD DEVIATION σ | 9.54 | 22.66 | 0.31 | 1.52 | 0.21 | 0.29 | 0.09 |

| MEASURE-MENT POINTS | S-value [mV/dec] (VD = 1V) | $\mu$FE[cm2/Vs] (VD = 1 V) (VD = 5 V) | $\mu$FE[cm2/Vs] (VD = 1 V) (max) | IG_on[pA] (VD = 1 V) (VG = 5 V) | IG_off[pA] (VD = 1 V) (VG = 6 V) |
|---|---|---|---|---|---|
| Point 1 | 85.00 | 174.08 | 311.34 | 0.18 | −0.17 |
| Point 2 | 75.40 | 203.65 | 326.07 | −0.03 | −0.33 |
| Point 3 | 81.00 | 189.82 | 298.79 | 0.08 | −0.28 |
| Point 4 | 67.10 | 188.86 | 323.97 | 0.09 | −0.34 |
| Point 5 | 75.80 | 160.44 | 281.53 | 0.09 | −0.30 |
| Point 6 | 89.60 | 190.77 | 328.03 | 0.33 | −0.27 |
| Point 7 | 87.60 | 160.91 | 297.70 | 0.34 | −0.33 |
| Point 8 | 93.40 | 155.67 | 304.09 | 0.11 | −0.31 |
| Point 9 | 87.50 | 171.22 | 285.34 | 0.03 | 0.48 |
| Point 10 | 81.10 | 160.82 | 304.09 | −0.14 | −0.03 |
| Point 11 | 81.70 | 178.37 | 322.64 | 0.08 | 0.10 |
| Point 12 | 82.50 | 216.52 | 396.51 | −0.11 | −0.48 |
| Point 13 | 76.90 | 199.35 | 328.89 | 0.00 | −0.51 |
| Point 14 | 83.90 | 236.08 | 364.85 | 0.54 | −0.58 |
| Point 15 | 93.40 | 185.05 | 318.16 | −0.29 | −0.31 |

TABLE 1-continued

|  |  |  |  |  |  |
|---|---|---|---|---|---|
| Point 16 | 89.70 | 167.40 | 283.96 | 0.12 | 0.38 |
| Point 17 | 72.00 | 190.44 | 286.92 | 0.20 | −0.10 |
| Point 18 | 93.50 | 179.37 | 298.65 | 0.23 | −0.09 |
| Point 19 | 88.30 | 163.20 | 283.82 | 0.81 | −0.38 |
| Point 20 | 77.60 | 203.17 | 355.26 | 0.26 | −0.18 |
| AVERAGE | 83.15 | 183.76 | 315.03 | 0.14 | −0.20 |
| STANDARD DEVIATION σ | 7.43 | 20.97 | 30.08 | 0.22 | 0.27 |

TABLE 2

| MEASUREMENT POINTS | Ion_1[uA] (VD = 1 V) (VG = 5 V) | Ion_2[uA] (VD = 5 V) (VG = 5 V) | Ioff_1[uA] (VD = 1 V) (VG = 6 V) | Ioff_2[uA] (VD = 5 V) (VG = 1 V) | Ion/Ioff1 | Ion/Ioff2 | Vth[V] (VD = 5 V) |
|---|---|---|---|---|---|---|---|
| Point 1 | 36.10 | 76.69 | 1.35 | 35.05 | 7.43 | 6.34 | −1.52 |
| Point 2 | 37.85 | 75.50 | 1.05 | 20.46 | 7.56 | 6.57 | −1.62 |
| Point 3 | 35.49 | 73.92 | 1.59 | 29.22 | 7.35 | 6.40 | −1.60 |
| Point 4 | 41.67 | 92.14 | 1.83 | 23.75 | 7.36 | 6.59 | −1.25 |
| Point 5 | 41.32 | 89.49 | 0.51 | 14.83 | 7.91 | 6.78 | −1.35 |
| Point 6 | 36.65 | 75.65 | 0.82 | 25.05 | 7.65 | 6.48 | −1.55 |
| Point 7 | 38.76 | 80.06 | 0.86 | 21.28 | 7.65 | 6.58 | −1.51 |
| Point 8 | 39.07 | 83.43 | 0.66 | 20.06 | 7.77 | 6.62 | −1.38 |
| Point 9 | 40.51 | 89.73 | 0.17 | 20.48 | 8.38 | 6.64 | −1.36 |
| Point 10 | 37.70 | 77.90 | 1.43 | 21.16 | 7.42 | 6.57 | −1.46 |
| Point 11 | 41.84 | 94.44 | 0.43 | 20.56 | 7.99 | 6.66 | −1.10 |
| Point 12 | 40.99 | 84.98 | 1.46 | 16.60 | 7.45 | 6.71 | −1.48 |
| Point 13 | 37.75 | 78.87 | 0.41 | 11.83 | 7.96 | 6.82 | −1.49 |
| Point 14 | 38.60 | 79.13 | 1.53 | 19.09 | 7.40 | 6.62 | −1.51 |
| Point 15 | 41.06 | 85.68 | 0.41 | 16.88 | 8.00 | 6.71 | −1.47 |
| Point 16 | 37.33 | 77.99 | 1.37 | 44.30 | 7.44 | 6.25 | −1.48 |
| Point 17 | 38.81 | 80.83 | 1.32 | 17.75 | 7.47 | 6.66 | −1.44 |
| Point 18 | 39.87 | 84.08 | 1.54 | 27.18 | 7.41 | 6.49 | −1.51 |
| Point 19 | 43.04 | 91.36 | 1.05 | 20.92 | 7.61 | 6.64 | −1.40 |
| Point 20 | 39.55 | 80.62 | 0.67 | 17.13 | 7.77 | 6.67 | −1.53 |
| AVERAGE | 39.20 | 82.63 | 1.02 | 22.18 | 7.65 | 6.59 | −1.45 |
| STANDARD DEVIATION σ | 2.07 | 6.14 | 0.49 | 7.37 | 0.28 | 0.14 | 0.12 |

| MEASUREMENT POINTS | S-value [mV/dec] (VD = 1V) | μFE[cm2/Vs] (VD = 1 V) (VD = 5 V) | μFE[cm2/Vs] (VD = 1 V) (max) | IG_on[pA] (VD = 1 V) (VG = 5 V) | IG_off[pA] (VD = 1 V) (VG = 6 V) |
|---|---|---|---|---|---|
| Point 1 | 94.30 | 155.19 | 155.19 | −0.10 | 0.11 |
| Point 2 | 128.10 | 161.10 | 165.87 | −0.12 | −0.16 |
| Point 3 | 77.69 | 150.99 | 155.24 | −0.04 | −0.25 |
| Point 4 | 128.04 | 150.61 | 161.20 | 0.13 | −0.32 |
| Point 5 | 106.32 | 153.62 | 164.68 | −0.30 | −0.07 |
| Point 6 | 63.48 | 146.27 | 156.24 | −0.28 | −0.20 |
| Point 7 | 78.86 | 154.67 | 163.01 | −0.32 | −0.24 |
| Point 8 | 98.47 | 144.56 | 158.58 | −0.27 | 0.08 |
| Point 9 | 98.42 | 144.56 | 162.15 | −0.28 | −0.21 |
| Point 10 | 101.49 | 150.76 | 156.57 | 0.23 | −0.18 |
| Point 11 | 70.93 | 135.11 | 159.53 | 0.27 | −0.06 |
| Point 12 | 94.08 | 160.63 | 169.98 | −0.22 | −0.34 |
| Point 13 | 95.57 | 153.43 | 156.67 | 0.17 | −0.14 |
| Point 14 | 82.63 | 162.44 | 163.30 | 0.17 | −0.39 |
| Point 15 | 88.00 | 164.59 | 169.98 | −0.14 | 0.17 |
| Point 16 | 96.32 | 152.76 | 155.14 | 0.10 | −0.26 |
| Point 17 | 114.06 | 160.39 | 160.53 | −0.35 | 0.26 |
| Point 18 | 73.32 | 152.38 | 169.45 | 0.09 | −0.12 |
| Point 19 | 95.09 | 163.97 | 174.55 | −0.26 | 0.20 |
| Point 20 | 88.12 | 166.97 | 168.59 | −0.21 | 0.04 |
| AVERAGE | 93.66 | 154.25 | 162.32 | −0.09 | −0.10 |
| STANDARD DEVIATION σ | 17.11 | 8.00 | 5.88 | 0.21 | 0.19 |

In Tables 1 and 2, attention should be paid to the facts that the S-value representing the subthreshold characteristic are as small as 60–100 mV/dec and that the mobility μFE is very large, i.e., 150–400 cm$^2$/V.s. In this specification, the mobility means the field-effect mobility.

The above data are of a kind that cannot be obtained by conventional TFTs, which in itself evidences that the performance of the TFT according to the invention is much superior and equivalent to that of a MOSFET formed on a single crystal.

It was also confirmed by repetitive measurements of an accelerated deterioration test that the TFT according to the invention is very hard to deteriorate. While it is empirically known that TFTs that operate at high speed is prone to deteriorate, the TFT according to the invention is free of deterioration and has a very high breakdown voltage.

For reference, Tables 1 and 2 show averages and standard deviations ay. The standard deviation is used as a measure of a variation from the average. In general, it is known that if measurement results (a population) has a normal distribution (Gaussian distribution), 68.3%, 95.4%, and 99.7% of all results exist in ±1σ, ±2σ, and ±3σ, respectively.

To evaluate variations of the TFT characteristics more accurately, the inventors measured 140 TFTs formed on the same substrate and calculated averages and standard variations from measurement results. Results were such that the S-value had averages 87.1 mV/dec (n-channel) and 105.6 mV/dec (p-channel) and standard deviations 9.1 (n-channel) and 25.3 (p-channel), and that the mobility had averages 277.8 $cm^2/V.s$ (n-channel) and 151.1 $cm^2/V.s$ (p-channel) and standard deviations 43.6 (n-channel) and 12.7 (p-channel).

That is, the n-channel TFT according to the invention has the following TFT characteristics:
(1) The σ value of the S-value falls within 15 mV/dec, preferably 10 mV/dec.
(2) The S-value falls within 90±45 mV/dec, preferably 90±30 mV/dec.
(3) The σ value of $\mu FE$ falls within 50 $cm^2/V.s$, preferably 45 $cm^2/V.s$.

The p-channel TFT according to the invention has the following TFT characteristics:
(1) The σ value of the S-value falls within 30 mV/dec, preferably 25 mV/dec.
(2) The S-value falls within 100±90 mV/dec, preferably 100±75 mV/dec.
(3) The σ value of $\mu FE$ falls within 20 $cm^2/V.s$, preferably 15 $cm^2/V.s$.

As described above, the TFT according to the invention exhibits much superior electrical characteristics and can constitutes 10 logic circuits that are required to operate at high speed, such as complicated SRAM and DRAM circuits.

Although this embodiment is directed to only the example manufacturing process of a TFT of a single gate structure, it can also be applied to a TFT of a double gate structure and even a TFT of a multi-gate structure having three or more gate electrodes.

The invention is implemented by improving the crystallinity of an active layer and hence can be practiced for any TFT structure as long as it has sufficient heat resistance.

Knowledge of Crystal Structural Body Obtained by the Invention

Figure 14:
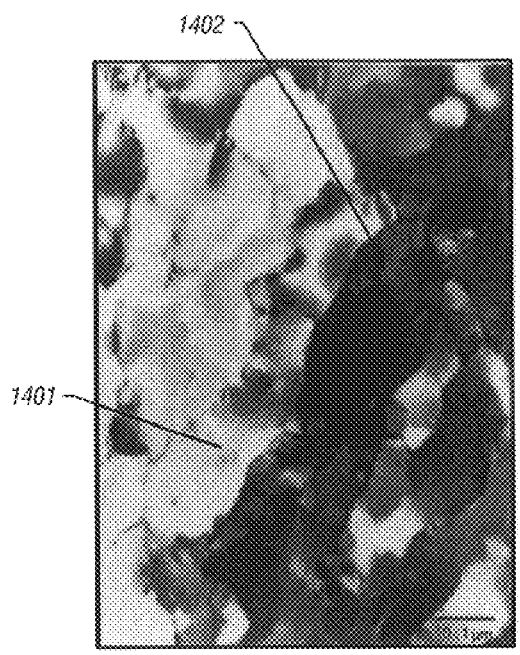
FIGS. 14 and 15 are photographs showing crystal structures.

It was described above that a crystalline silicon film obtained by the invention is a crystal structural body that is a collection of needle-like or columnar crystals as shown in FIG. 14. In this section, a comparison is made between the crystal structural body of the invention and a crystal structural body formed by another method.

Figure 15:
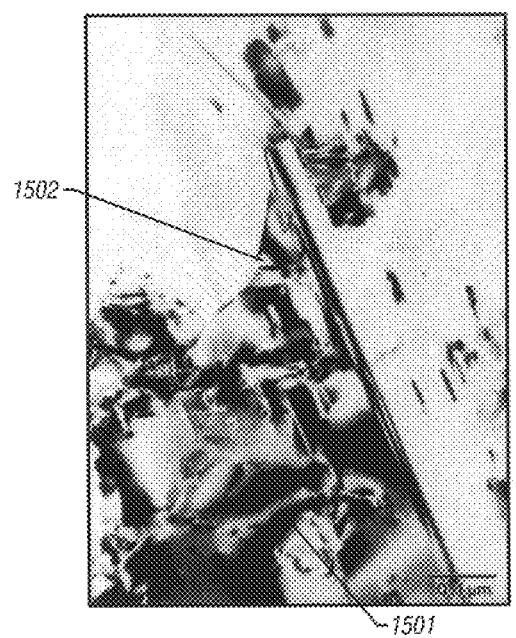

A crystal structural body shown in FIG. 15 is one obtained by crystallizing an amorphous silicon film under different conditions than in the invention. More specifically, an amorphous silicon film was crystallized by performing a heat treatment at 600° C. for 48 hours in a nitrogen atmosphere and then subjected to a thermal oxidation treatment of about 900°–1,100° C.

As shown in FIG. 15, in a crystalline silicon film formed in the above manner, individual crystal grains are separated from each other by grain boundaries that are distributed irregularly.

In FIG. 15, a crystal grain 1501 is surrounded by irregular grain boundaries 1502. Therefore, if the crystal structural body of FIG. 15 were actually used as an active layer of a TFT, energy barriers generated by the irregular grain boundaries 1502 would obstruct carrier movement.

In contrast, in the crystal structural body shown in FIG. 14, crystal grains 1402 are arranged with a certain degree of regularity. Therefore, it is considered that no energy barrier that obstructs carrier movement exists inside each needle-like or columnar crystal.

By observing the arrangement of needle-like or columnar crystals over a wide viewing range with magnification of ten to fifty thousand, the inventors found a case that a needle-like or columnar crystal runs in a zigzag. It is presumed that this is a phenomenon that occurs such that the crystal growth proceeds in a direction leading to positions that are stable in terms of energy, and that a certain type of grain boundary is formed at a position where the crystal direction is changed.

However, the inventors presume that this grain boundary that may occur inside a needle-like or columnar crystal is like a twin crystal grain boundary that is inactive in terms of energy. That is, the inventors consider that this grain boundary is formed by crystal portions that run in different directions but are connected continuously in a well matched manner, and that it does not serve as such an energy barrier as obstructs carrier movement (substantially, it is not regarded as a grain boundary).

As described above, a crystalline silicon film that is crystallized by a common process has a crystal structure as shown in FIG. 15, and is difficult to provide a high mobility because irregular grain boundaries extend so as to obstruct carrier movement.

In contrast, it is considered that the crystalline silicon film according to the invention has a crystal structure as shown in FIG. 14 in which grain boundaries have directivity and no gain boundaries serving as an energy barrier exists inside each needle-like or columnar crystal. Since carriers can move through the inside of crystals without being obstructed at all, the crystalline silicon film can provide a very high mobility.

In particular, attention should be paid to the fact that a needle-like or columnar crystal according to the invention is believed to continuously grow over as long a distance as tens to hundreds of micrometers while avoiding strain due to an asperity, stress, or the like, i.e., changing the crystal direction.

If the presumption of the inventors is correct, the crystalline silicon film according to the invention can be said to be an entirely new crystal structural body that is a collection of special crystals that have grown without forming in themselves any grain boundaries possibly serving as carrier traps.

Embodiment 2

This embodiment is directed to a case of forming a CMOS circuit by TFTs according to the first embodiment, that is, by combining complementarily an n-channel TFT and a p-channel TFT each having a structure as described in the first embodiment.

A manufacturing process of a CMOS circuit according to this embodiment will be described below with reference to FIGS. 7A–7D and 8A–8C. The application range of the crystalline silicon film that is formed according to the invention is wide and the method for forming a CMOS circuit is not limited to the one according to this embodiment.

First, a silicon oxide film 702 is formed on a quarts substrate 701 and a crystalline silicon film (not shown) is formed thereon according to the manufacturing process of the first embodiment. The crystalline silicon film is then patterned into an active layer 703 of an n-channel TFT and an active layer 704 of a p-channel TFT.

After the formation of the active layers 703 and 704, a gate insulating film 705 is formed and then a heat treatment is performed in an atmosphere containing a halogen element. In this embodiment, the processing conditions are set the same as in the first embodiment. Thus, the active layers 703 and 704 are crystal structural bodies according to the invention and the gate insulating film 705 is given a superior interface and film quality.

Then, an aluminum film (not shown) to later constitute starting patterns of a gate electrode is formed and patterned into aluminum film patterns 706 and 707. (Resist masks that were used to form the patterns 706 and 707 are left as they are even after the pattern formation.)

Figure 7A:
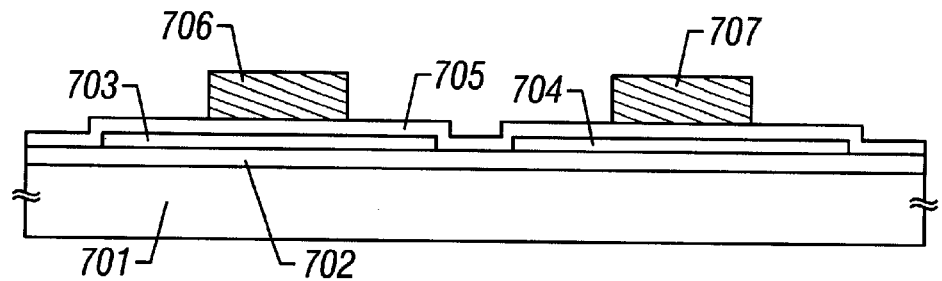
FIGS. 7A–7D and 8A–8C show a manufacturing process of a CMOS circuit according to a second embodiment of the invention.

Thus, the state of FIG. 7A is obtained. After the formation of the aluminum film patterns 706 and 707, porous anodic oxide films 708 and 709 are formed on the side faces of the aluminum film patterns 706 and 707 under the same conditions as in the first embodiment. In this embodiment, the thickness of the porous anodic oxide films 708 and 709 are set at 0.5 µm.

Figure 7B:
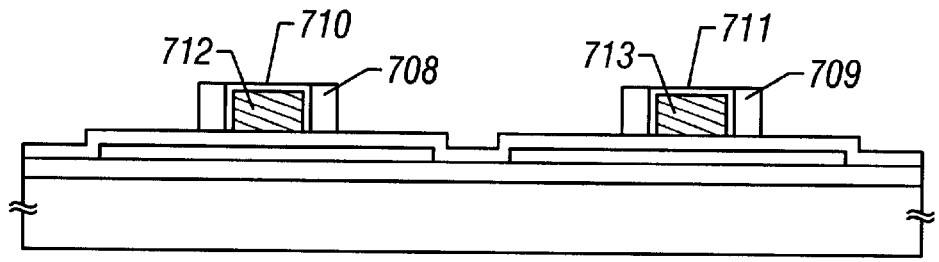

Further, dense and strong anodic oxide films 710 and 711 are formed under the same conditions as in the first embodiment except that in this embodiment the final voltage is adjusted so that film thickness becomes 700 Å. This step defines gate electrodes 712 and 713. Thus, the state of FIG. 7B is obtained.

In this state, the gate insulating film 705 is etched by dry etching. In this etching step, the gate electrodes 712 and 713 and the porous anodic oxide films 708 and 709 serve as masks and the gate insulating film 705 partially remains only right under the masks. The state of FIG. 7C is obtained by removing the porous anodic oxide films 708 and 709 after the etching.

Then, after a resist mask 714 is formed so as to cover the p-channel TFT, P (phosphorus) ions are implanted as an impurity for imparting n-type conductivity. This doping is performed under the conditions that the acceleration voltage is 50 kV and the dose is $0.1–5\times10^{13}$ atoms/cm$^2$, preferably $0.5–2\times10^{13}$ atoms/cm$^2$.

Figure 7C:
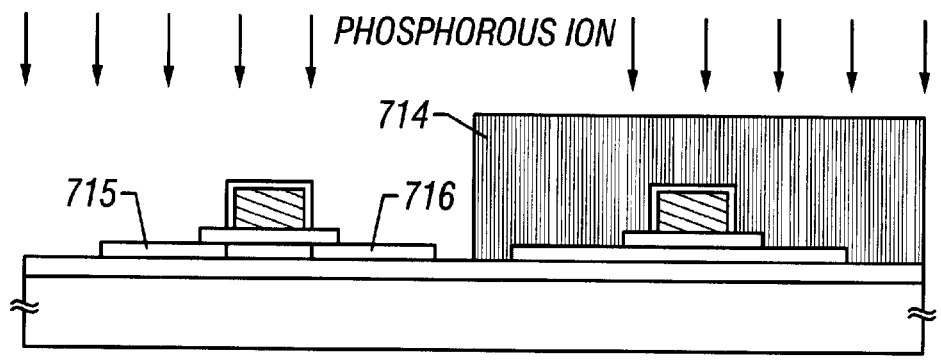

In this doping step, because of the relatively high acceleration voltage, P ions are implanted into the active layer 703 through the exposed portions of the gate insulating film, so that P ions are added to regions 715 and 716 (see FIG. 7C).

Thereafter, as shown in FIG. 7D, P ions are again implanted under the conditions that the acceleration voltage is set as low as 5 kV and the dose is $0.1–1\times10^{15}$ atoms/cm$^2$, preferably $2–5\times10^{14}$ atoms/cm$^2$. As a result of this step, regions 717 and 718 are formed which are heavily doped with P ions.

Figure 7D:
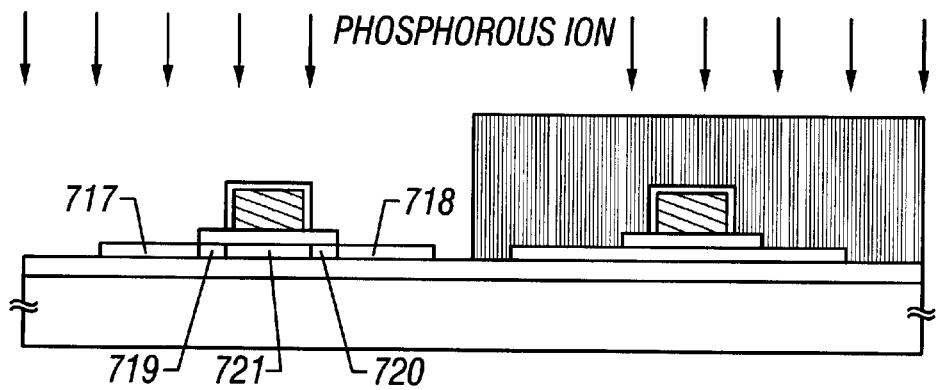

The active layer of the n-channel TFT is completed when the step of FIG. 7D is finished. That is, a source region 717, a drain region 718, low-concentration impurity regions (or a LDD region) 719 and 720, and a channel forming region 721 of the n-channel TFT are defined.

Figure 8A:
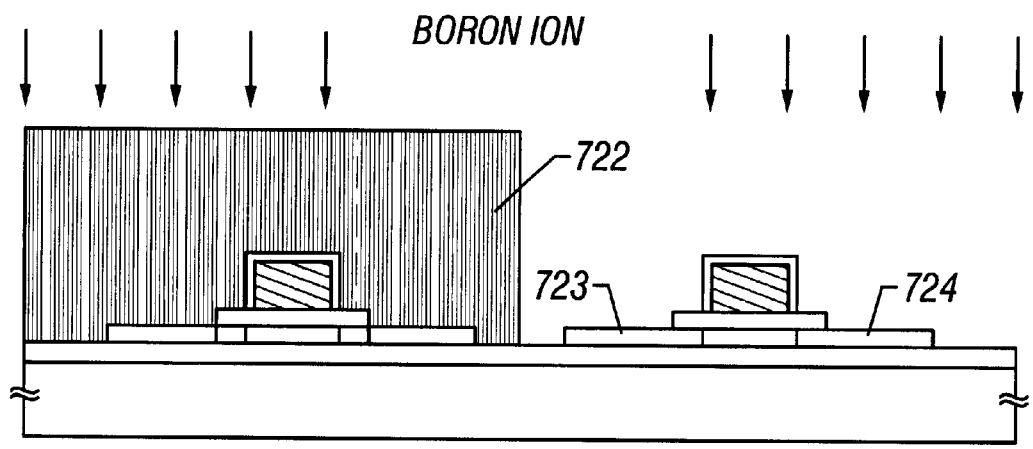

Subsequently, a resist mask 722 is formed so as to cover the left-hand n-channel TFT as shown in FIG. 8A. In this state, B (boron) ions are implanted as an impurity for imparting p-type conductivity. B ions are implanted in two steps as in the above case of P ions.

In the first doping of B ions, the acceleration voltage is set at 30 kV and the dose is set at $0.1–5\times10^{14}$ atoms/cm$^2$, preferably $0.5–2\times10^{14}$ atoms/cm$^2$. As a result of this step, regions 723 and 724 are doped with B ions (see FIG. 8A).

In the second doping of B ions, the acceleration voltage is set at 5 kV and the dose is set at $0.1–1\times10^{15}$ atoms/cm$^2$, preferably $2–5\times10^{14}$ atoms/cm$^2$. As a result of this step, regions 725 and 726 are formed which are heavily doped with B ions (see FIG. 8B).

As a result of the above steps, a source region 725, a drain region 726, low-concentration impurity regions (or a LDD region) 727 and 728, and a channel forming region 729 are defined.

Figure 8B:
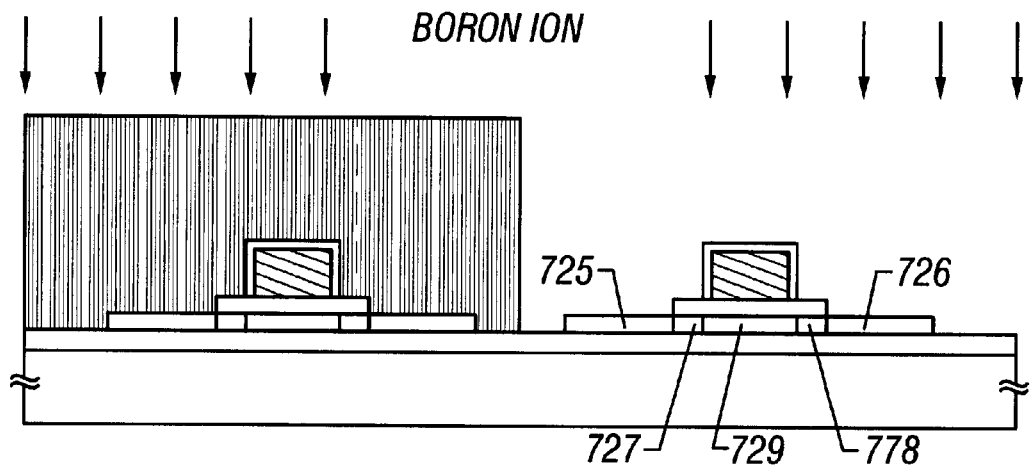

After the completion of the step of FIG. 8B, the resist mask 722 is removed and the entire substrate is irradiated with strong light such as laser light, infrared light, or ultraviolet light. As a result of this step, the added ions are activated and damage in the ion-implant ed regions is repaired.

Thereafter, a 4,000-Å-thick interlayer insulating film 730 is formed. The interlayer insulating film 730 may be any of a silicon oxide film, a silicon oxynitride film, a silicon nitride film, a nd a n organic resin film, or may have a multilayered structure. Such an insulating film may be formed by plasma CVD, thermal CVD, or spin coating.

Then, after contact holes are formed, a source electrode 731 of the n-channel TFT and a source electrode 732 of the p-channel TFT are formed. A drain electrode 733 is shared by the n-channel and p-channel TFTs. Thus, a CMOS circuit is completed (see FIG. 8C).

Figure 8C:
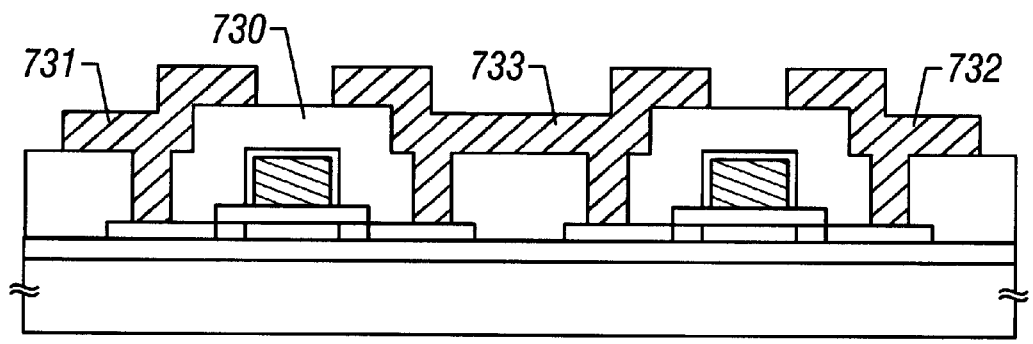

The CMOS circuit having the structure shown in FIG. 8C is manufactured through the above-described process. The CMOS circuit is a simplest form of invertor circuit. A closed circuit constructed by connecting an odd number of CMOS invertor circuits in series is called a ring oscillator, and is used in evaluating the operation speed of a semiconductor device.

Figure 9A:
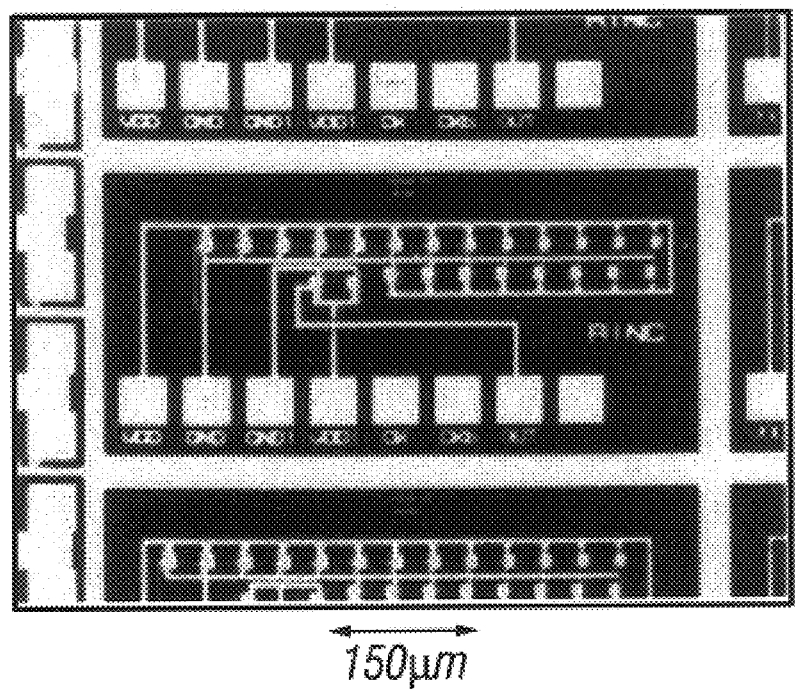
FIGS. 9A and 9B are photographs of a ring oscillator and a shift register circuit.

FIG. 9A is a top photograph of a ring oscillator circuit that was constructed by combining CMOS circuits manufactured according to this embodiment. The inventors actually constructed an experimental model of an active matrix liquid crystal display device by utilizing the invention and checked the operation performance of its driver circuits by means of a ring oscillator.

It is noted that in the CMOS circuits that constitute the ring oscillator of FIG. 9A, the gate electrodes are as narrow as about 0.6 µm and the channel forming regions are shortened to such an extent as to cause the short channel effect.

Figure 9B:
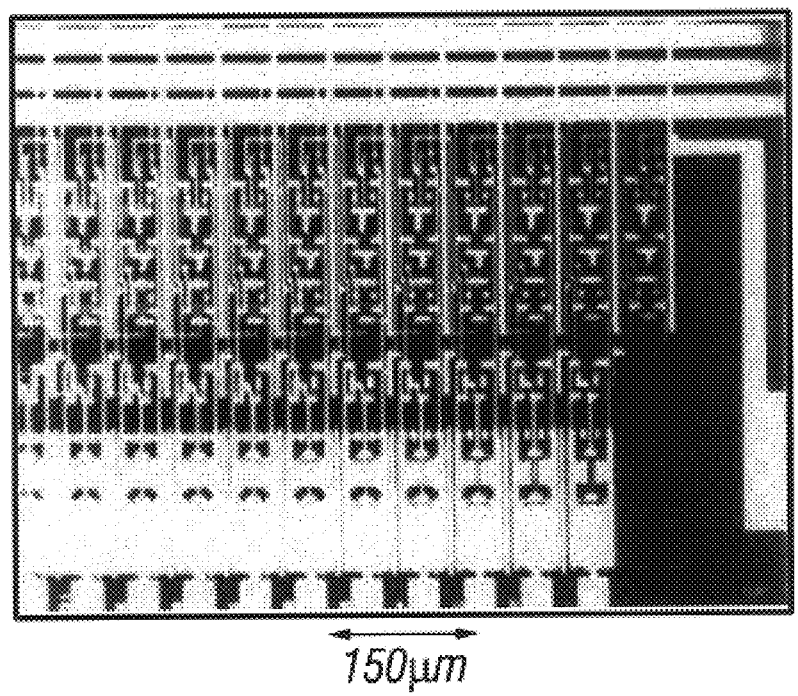

For reference, FIG. 9B is a photograph of a shift register-circuit, which is one of important circuits that constitute the experimentally manufactured peripheral driver circuits and is a logic circuit for designating the address of a pixel circuit. In particular, a horizontal scanning (source side) shift register circuit is required to perform driving at a very high frequency of several megahertz to tens of megahertz during actual operation.

Figure 10:
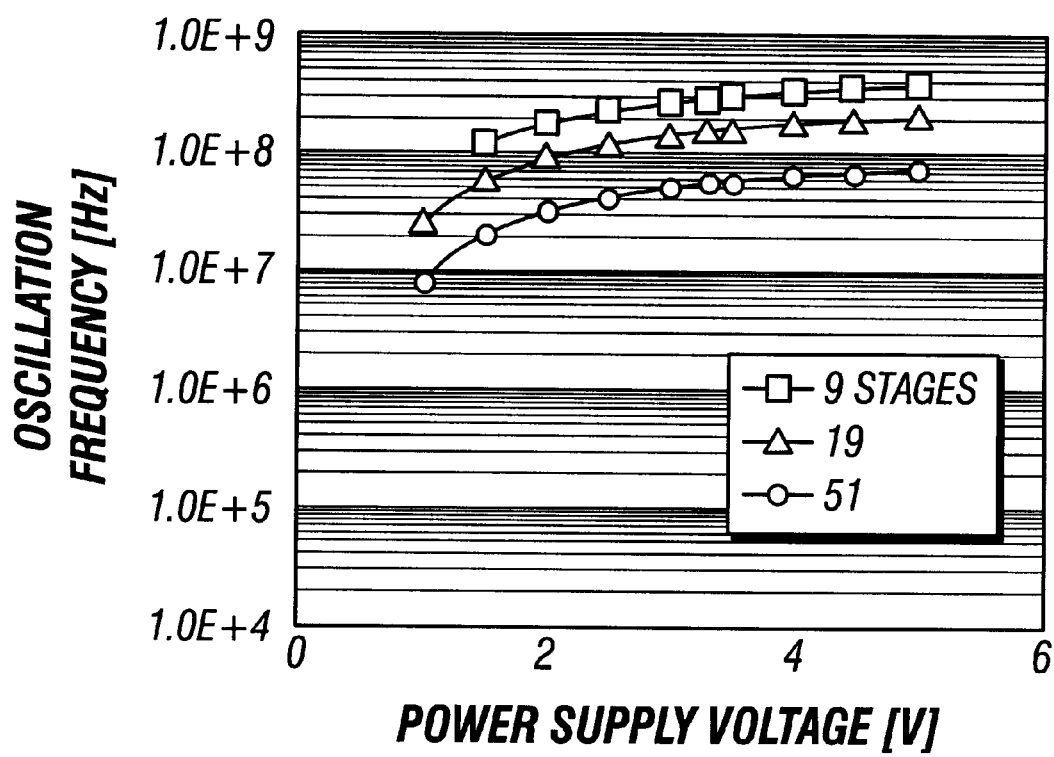
FIGS. 10 and 11 show measurement results of ring oscillators.

FIG. 10 shows measurement results of oscillation frequencies of ring oscillators as shown in FIG. 9A. Measurements were conducted on ring oscillators in which CMOS circuits are connected to each other in 9, 19, and 51 stages, to determine relationships between the power supply voltage and the oscillation frequency. The results of FIG. 10 are average data.

Figure 11A:
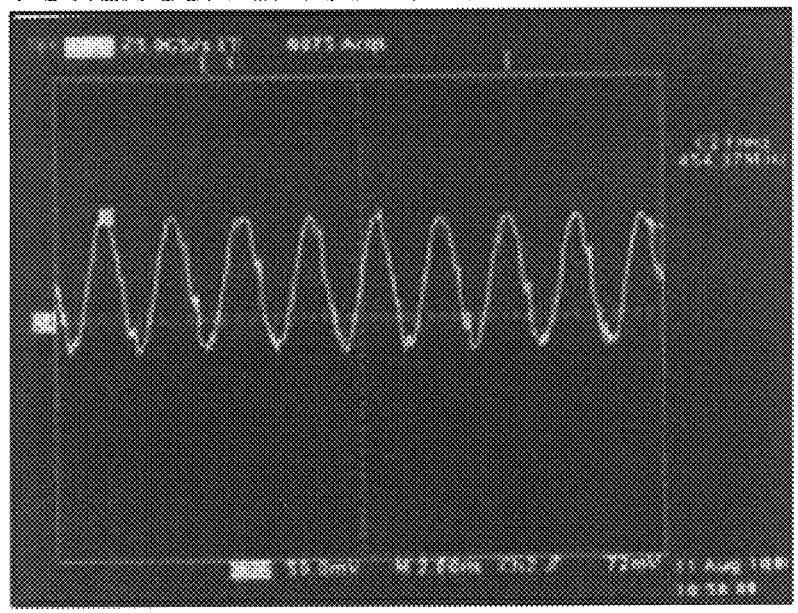
Figure 11B:
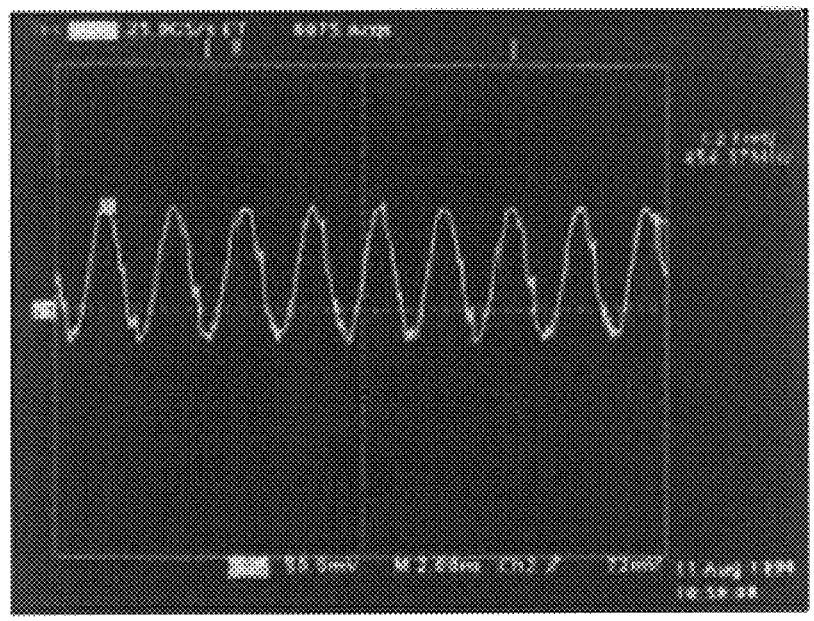

It is seen from FIG. 10 that the 9-stage ring oscillator with a power supply voltage of 5 V, for instance, attains an oscillation frequency of 402 MHz and hence operates at very high speed. Further, the inventors obtained data of maximum oscillation frequencies of 454.37 MHz (power supply voltage: 3.3 V) and 539.51 MHz (5 V). For reference, FIG. 11 shows waveforms that were measured when the maximum frequency data were obtained.

The above values mean that the ring oscillators manufactured according to this embodiment have operation speeds that are close to 20 times the operation speeds of ring oscillators that are manufactured by the conventional manufacturing process. Even when the power supply voltage is varied in the range of 1–5 V, the ring oscillators of this embodiment provide oscillation frequencies of tens to hundreds of megahertz.

As described above, the CMOS circuit according to the invention can operate at high speed without any problem even in a situation that certain value is unavoidably added in circuit design, and hence has such performance as to accommodate any requirements of a logic circuit.

In addition, the TFT according to the invention has such a high breakdown voltage as to withstand very-high speed operation as described in this embodiment in spite of the very short channel length of 0.6 μm. This means that the TFT according to the invention is hardly affected by the short channel effect and hence is extremely high in reliability.

Inferences Derived from Features of the Invention

As described in the first and second embodiments based on the experimental data, the TFT that is manufactured according to the invention exhibits extremely high performance (high-speed operation and a high breakdown voltage). Further, the feature that the TFT is less prone to deterioration in spite of its high operation speed is peculiar empirically. Thus, the inventors considered why the TFT according to the invention is so less prone to deterioration and have inferred the following theory.

In considering the reason for a high breakdown voltage of the TFT according to the invention, the inventors attached greater importance to the influence of grain boundaries of needle-like or columnar crystals. That is, the inventors inferred that grain boundaries (presumed to be oxide regions) locally existing in the channel forming region effectively weaken a strong electric field between the source and drain regions, particularly between the channel forming region and the drain region.

Specifically, the inventors thought that grain boundaries particularly weaken an electric field formed by charge of a depletion layer that develops from the drain region and prevent the source-side diffusion potential from being varied even in a state that the drain voltage is increased (drain-side depletion layer charge is increased).

In summary, where the crystalline silicon film of the invention is used as the active layer, it is considered that the channel forming region has the following features:

(1) The channel forming region has substantially intrinsic (for carriers) regions (the inside of needle-like or columnar crystals) where carriers are allowed to move.

(2) The channel forming region has energy barriers that suppress carrier movement or weaken an electric field developing in the channel direction (source-drain direction).

Therefore, it would be concluded that the TFT according to the invention having superior characteristics can be manufactured by forming a channel forming region that has the above two features, i.e., regions that are substantially intrinsic for carriers and local energy barriers.

The above conclusion is one derived from the experimental data of the inventors with some inference though. Thus, the inventors thought that the same advantages could be obtained by artificially creating the above features.

As a result, the inventors have succeeded in proposing a configuration that is effective in preventing the short channel effect. This configuration will be outlined below. It is noted that at present the following discussions are still within the level of inference.

The term "short channel effect" is generically used to refer to a reduction in threshold voltage, deterioration of the breakdown voltage characteristic due to the punch-through phenomenon, deterioration of the subthreshold characteristic, etc. The punch-through phenomenon, which is particularly problematic, is a phenomenon in which expansion of a drain-side depletion layer to the source region reduces the source-side diffusion potential, to cause punch-though current to flow between the source and drain.

Paying attention to the effect of grain boundaries according to the invention, the inventors inferred that in a short channel TFT having a channel length of about 0.01–2 μm, the effect of suppressing the expansion of a drain-side depletion layer could be obtained by providing, artificially and locally, impurity regions in the channel forming region.

Figure 12A:
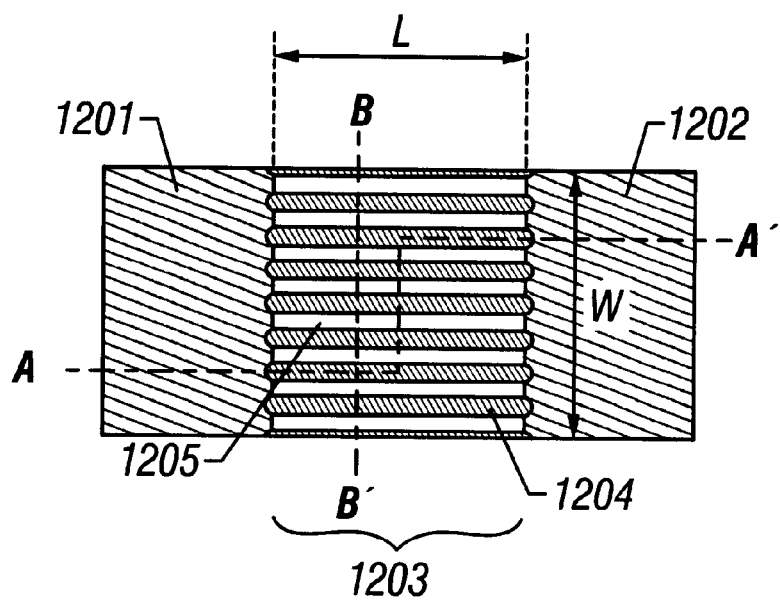
FIGS. 12A–12C show a configuration of an active layer.
Figure 12B:
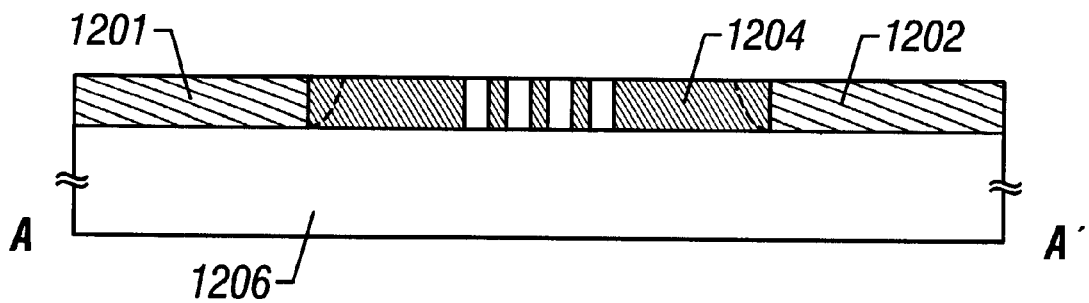
Figure 12C:
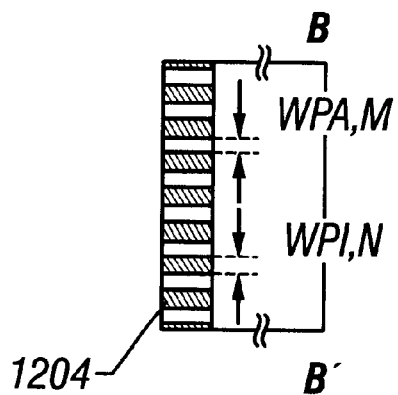
Figure 13:
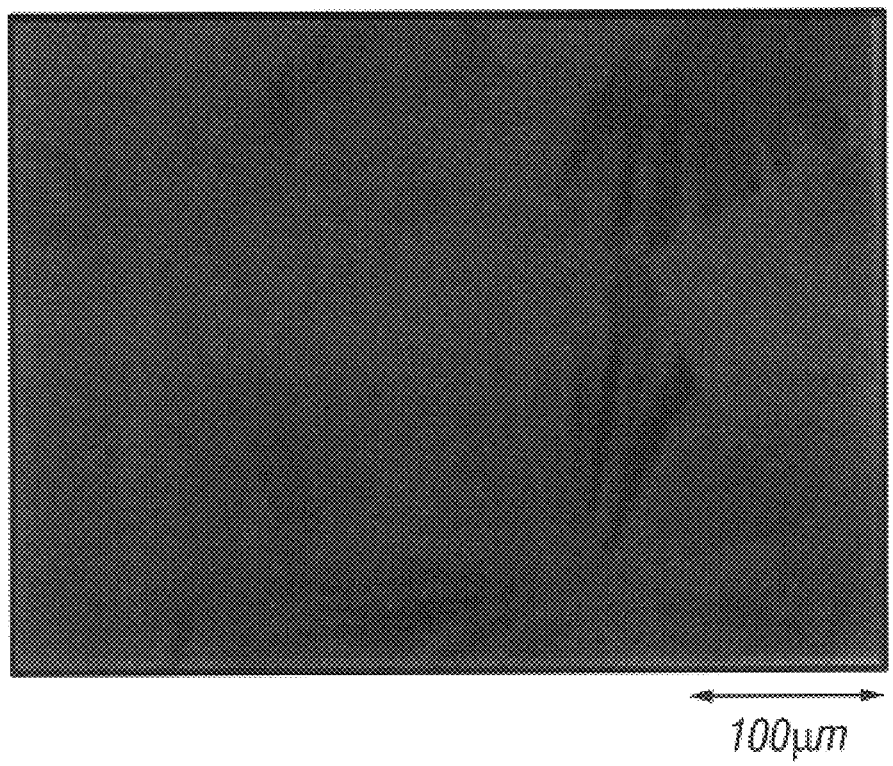
FIG. 13 is a photograph of the surface of a crystalline silicon film.

It is considered that this configuration can be realized by a specific structure shown in FIGS. 12A-12C. In FIG. 12A, reference numerals 1201–1203 denote a source region, a drain region, and a channel forming region, respectively, and impurity regions 1204 are artificially formed in the channel forming region 1203. In the channel forming region 1203, the regions other than the impurity regions 1204 are substantially intrinsic regions where carriers are allowed to move.

It is important that the structure of FIG. 12A is a simulated version of the crystal structural body according to the invention which is shown in FIG. 14. That is, the grain boundaries 1402 and the needle-like or columnar crystals 1401 in FIG. 14 correspond to the impurity regions 1204 and the carrier movement regions 1205 in FIG. 12A, respectively.

Therefore, it is expected that the impurity regions 1204 disposed locally form regions having large built-in potentials (which can also be expressed as energy barriers) in the channel forming region 1203 and the energy barriers effectively suppress expansion of a drain-side depletion layer.

FIG. 12B is a sectional view taken along line A–A' in FIG. 12A. Reference numeral 1206 denotes a substrate having an insulating surface. FIG. 12C is a sectional view taken along line B–B' in FIG. 12A.

In FIG. 12C, $w_{pi,n}$ and $w_{pa,m}$ represent the width of an nth impurity region 1204 and the width of an mth carrier movement region in the channel forming region 1203, respectively.

Therefore, to calculate a true field-effect mobility of the TFT according to the invention, an effective channel width $W_{pa}$ (sum of $w_{pa,\ m}$'s; m=1 to M (the number of carrier movement regions 1205)) should be substituted into W of the following theoretical equation:

$$\mu FE = 1/Cox(\Delta Id/\Delta Vg) \cdot 1/Vd \cdot L/W$$

where Cox is the capacitance of the gate oxide film, ΔId and ΔVg are variations of the drain current Id and the gate voltage Vg, Vd is the drain voltage, and L and W are the channel length and width.

However, since in practice it is impossible to measure the effective channel width $W_{pa}$, the field-effect mobility as used in this specification is one calculated by substituting a design value W of the channel width into the above equation which would be smaller than the true mobility.

Further, it is expected that arranging the impurity regions 1204 in the manner shown in FIG. 12A is very meaningful in increasing the mobility, for the reasons described below.

The mobility ($\mu$FE) is determined by scattering of carriers in a semiconductor film (assumed to be a silicon film in the following discussion), and scattering in a silicon film is generally classified into lattice scattering and impurity scattering. The total mobility $\mu$, which reflects both factors, is given by $$\mu = (1/\mu_l + 1/\mu_i)^{-1}. \tag{1}$$

Equation (1) means that the total mobility $\mu$ is in inverse proportion to the sum of reciprocals of mobility $\mu_l$ (suffix "l" is for lattice) that reflects influence of the lattice scattering and mobility pi (suffix "i" is for impurity) that reflects influence of the impurity scattering. The mobilities $\mu_l$ and $\mu_i$ are expressed as $$\mu_l \propto (m^*)^{-5/2} T^{-3/2} \tag{2}$$

$$\mu_i \propto (m^*)^{-1/2} N_i^{-1} T^{3/2}. \tag{3}$$

Formulae (2) and (3) indicate that in a state that an impurity is added to the entire channel forming region the mobility cannot be improved because of the influence of the impurity scattering. In contrast, in the configuration shown in FIGS. 12A–12C, since the impurity regions 1204 are formed locally, the carrier movement regions 1205 are not doped with any impurity and are intrinsic for carriers.

Theoretically, the concentration Ni of ionized impurities in Formula (3) is made infinitely close to 0 and hence the mobility $\mu_i$ infinitely approaches infinity. In Equation (1), this means that the impurity concentration is reduced to such an extent that the term $1/\mu_i$ can be disregarded, and hence the total mobility $\mu$ would become infinitely close to the mobility $\mu_l$.

Further, it is important that the impurity regions 1204 be arranged substantially parallel with the channel direction. This arrangement corresponds to the case where the extending direction of the grain boundaries of the needle-like or columnar crystals shown in FIG. 14 coincides with the channel direction.

With this arrangement, it is expected that the impurity regions 1204 behave as "benign grain boundaries". Therefore, they would not capture carriers and play a rail-like role to define the carrier movement direction. This is a very important feature in reducing the influence of scattering due to collision between carriers.

Further, it is expected that the above configuration can suppress reduction in threshold voltage which is one aspect of the short channel effect. This expectation is based on an inference that the narrow channel effect that occurs when the channel is rendered extremely narrow can be caused artificially between the impurity regions 1204.

As described above, it is considered that the punch-through phenomenon can be prevented by suppressing the expansion of a drain-side depletion layer. By preventing the punch-through phenomenon, not only the breakdown voltage characteristic but also the subthreshold characteristic (S-value) would be improved.

The improvement in subthreshold characteristic is explained below based on an inference that the volume of a drain-side depletion layer can be reduced by using the configuration being discussed.

If the configuration of FIG. 12A can effectively suppress expansion of a depletion layer, it should be possible to greatly reduce the volume of a drain-side depletion layer. Since the total depletion layer charge can be reduced, the depletion layer capacitance could also be reduced. The S-value is expressed by the following approximated formula:

$$S \approx \ln 10 (kT/q) \{1 + (Cd + Cit)/Cox\} \tag{4}$$

where k is the Boltzmann constant, T is the absolute temperature, q is the magnitude of electronic charge, Cd is the depletion layer capacitance, Cit is the equivalent capacitance of interface states, and Cox is the gate oxide film capacitance. Therefore, in the configuration being discussed, there is a possibility that the ideal state of Cd=Cit=0, i.s., a semiconductor device with an S-value of 60 mV/decade is realized by making the depletion layer capacitance Cd and the equivalent capacitance Cit of interface states as close to 0 as possible.

However, it is noted that Formula (4) is an approximated formula of the S-value. In TFTs, a measurement value smaller than 60 mV/decade may be obtained not according to Formula (4).

Incidentally, in the configuration being discussed which has been proposed according to the invention, the impurity regions 1204 which correspond to the grain boundaries according to the invention may be formed by using nitrogen or carbon in addition to oxygen. This is because in this configuration it is intended to artificially disposing energy barriers in the channel forming region 1203.

From the viewpoint of forming energy barriers, even impurity regions whose conductivity type is opposite to that of the inversion layers would be effective. That is, the impurity regions 1204 may be formed by using B ions in an n-channel semiconductor device and P ions in a p-channel semiconductor device.

Where the impurity regions 1204 are formed by using P ions or B ions, the threshold value can be controlled directly by the concentration of added impurity ions.

As described above, the above configuration was derived through inference of the inventors based on the concept of the invention and the experimental facts. It is presumed that the short channel effect which is problematic in deep-submicron semiconductor devices having extremely short channels can be prevented effectively by utilizing the above configuration.

Embodiment 3

This embodiment is directed to a manufacturing process that is different than in the first embodiment. More specifically, before formation of the active layer, a crystalline silicon film is subjected to a heat treatment in an atmosphere containing a halogen element to remove nickel by gettering.

By combining the step of this embodiment with the manufacturing process of the first embodiment, the nickel concentration of the active layer can further be reduced effectively.

Further, since the thickness of the crystalline silicon film is reduced by the heat treatment of higher than 700° C., the active layer can be made thinner. The thinned active layer will provide advantages of an increased in mobility and a decrease in off-current.

Embodiment 4

This embodiment is directed to a manufacturing process that is different than in the first embodiment. More specifically, the step of forming the gate insulating film 107 in the first embodiment is eliminated and a heat treatment in an atmosphere containing a halogen element is performed immediately after the formation of the active layer.

A thermal oxidation film that is formed at this step is improved in film quality by subjecting it to annealing in a nitrogen atmosphere as in the case of the first embodiment. In this embodiment, it is possible to constitute a gate insulating film only by this thermal oxidation film. The thermal oxidation film may be formed in a thickness range of 100–1,500 Å (typically 500–1,000 Å) by adjusting the conditions of the heat treatment.

This embodiment is characterized in that a semiconductor device capable of high-speed operation can be manufactured by constituting the gate insulating film only by the thermal oxidation film, and that the step of forming the gate insulating film can be simplified. However, in many cases, it is difficult to provide a uniform thickness distribution.

It is possible to deposit, by a vapor-phase method, an insulating film on the thermal oxidation film that was formed by the above step, to constitute a gate insulating film (lamination film) together with the thermal oxidation film. In this case, the gate breakdown voltage is increased. However, it is important that the interface between the thermal oxidation film and the film formed by the vapor-phase method be kept clean.

It is also possible to regard the above step as a step of removing the metal elements (particularly nickel). That is, the thermal oxidation film that was formed by the above step is removed and then a thermal oxidation is again formed as a gate insulating film. Alternatively, a gate insulating film may be formed on the active layer by a vapor-phase method after the removal of the thermal oxidation film. In this case, although the concentrations of unnecessary impurities existing at the interface between the active layer and the gate insulating film can be reduced, care should be taken to keep the cleanliness of the active layer surface high.

Embodiment 5

This embodiment is directed to a case where a TFT that is manufactured according to the invention is applied to a DRAM (dynamic random access memory) and an SRAM (static random access memory). This embodiment will be described with reference to FIGS. 16A and 16B.

Figure 16A:
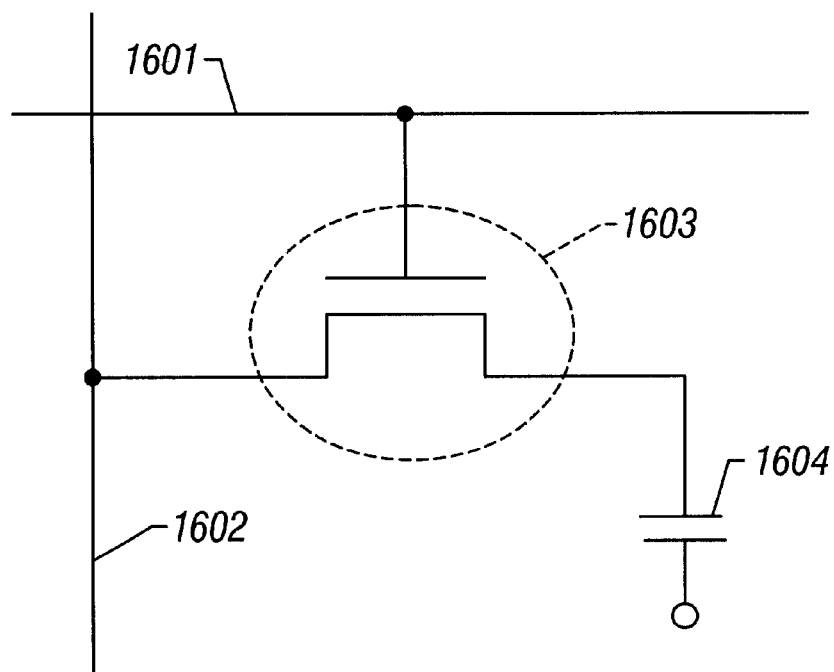
FIGS. 16A and 16B show configurations of a DRAM and an SRAM according to a fifth embodiment of the invention.

The DRAM is a memory in which information is stored in the form of charge in a capacitor. Input and output of charge (information) to and from the capacitor is controlled a TFT that is connected in series to the capacitor. FIG. 16A shows a circuit of a TFT and a capacitor which circuit constitutes one memory cell of a DRAM.

When supplied with a gate signal from a word line 1601, a TFT 1603 is rendered conductive. In this state, charge is supplied to a capacitor 1604 from a bit line 1602 to capture information or charge is removed from the capacitor 1604 to read out information. That is, the DRAM serves as a storage device such that charge is written to or read from the capacitor 1604 by means of the TFT 1603.

As for the features of the DRAM, it is suitable to construct a large-scale memory of a high integration density because each memory cell is constituted of a very small number of parts, i.e., one TFT and one capacitor. Because of a low price, at present the DRAM is used in a largest number among various memory devices.

Where a DRAM cell is formed by using a TFT, the storage capacitance can be set small, which enables low-voltage operation.

Figure 16B:
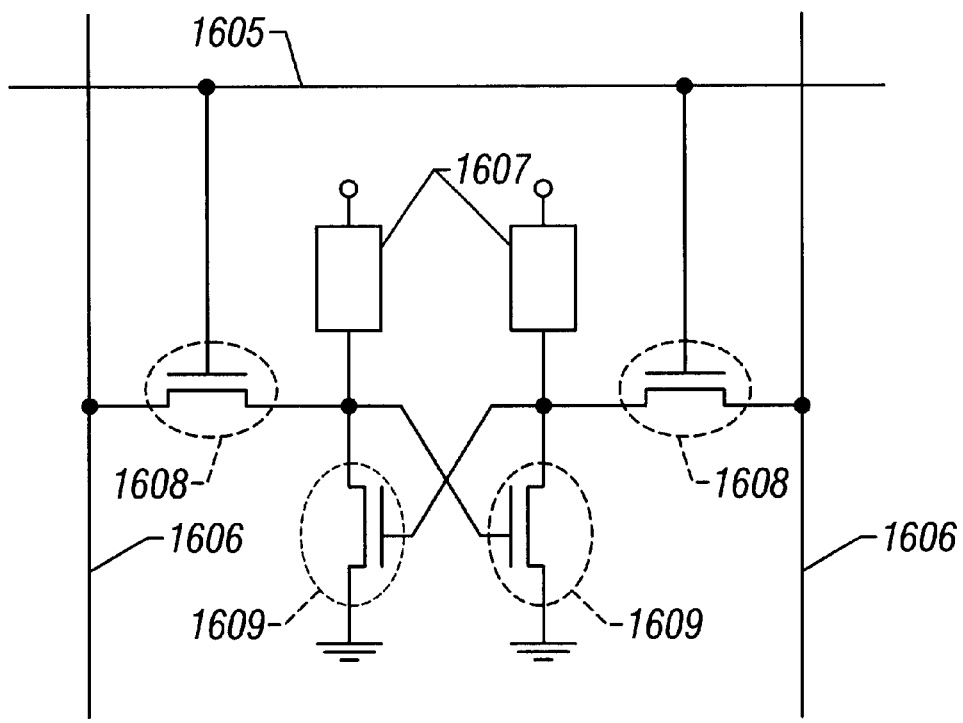

FIG. 16B shows an SRAM circuit in which high resistances are used as passive load elements. It is also possible to employ an SRAM structure in which TFTs are substituted for the passive load elements to play the same role.

The SRAM is a memory in which a bistable circuit such as a flip-flop is used as a storage device, and stores binary information values (0 and 1) such that they correspond to the two stable states on/off or off/on of the bistable circuit. The SRAM is advantageous in holding stored information as long as it is supplied with a voltage.

In FIG. 16B, reference numeral 1605 and 1606 denote a word line and bit lines, respectively, and 1607 denotes a load elements that are high resistances. The SRAM further includes a pair of driver transistors 1608 and a pair of access transistors 1609.

The above-configured SRAM is advantageous in high operation speed, high reliability, and being easily incorporated in a system.

Embodiment 6

Figure 20:
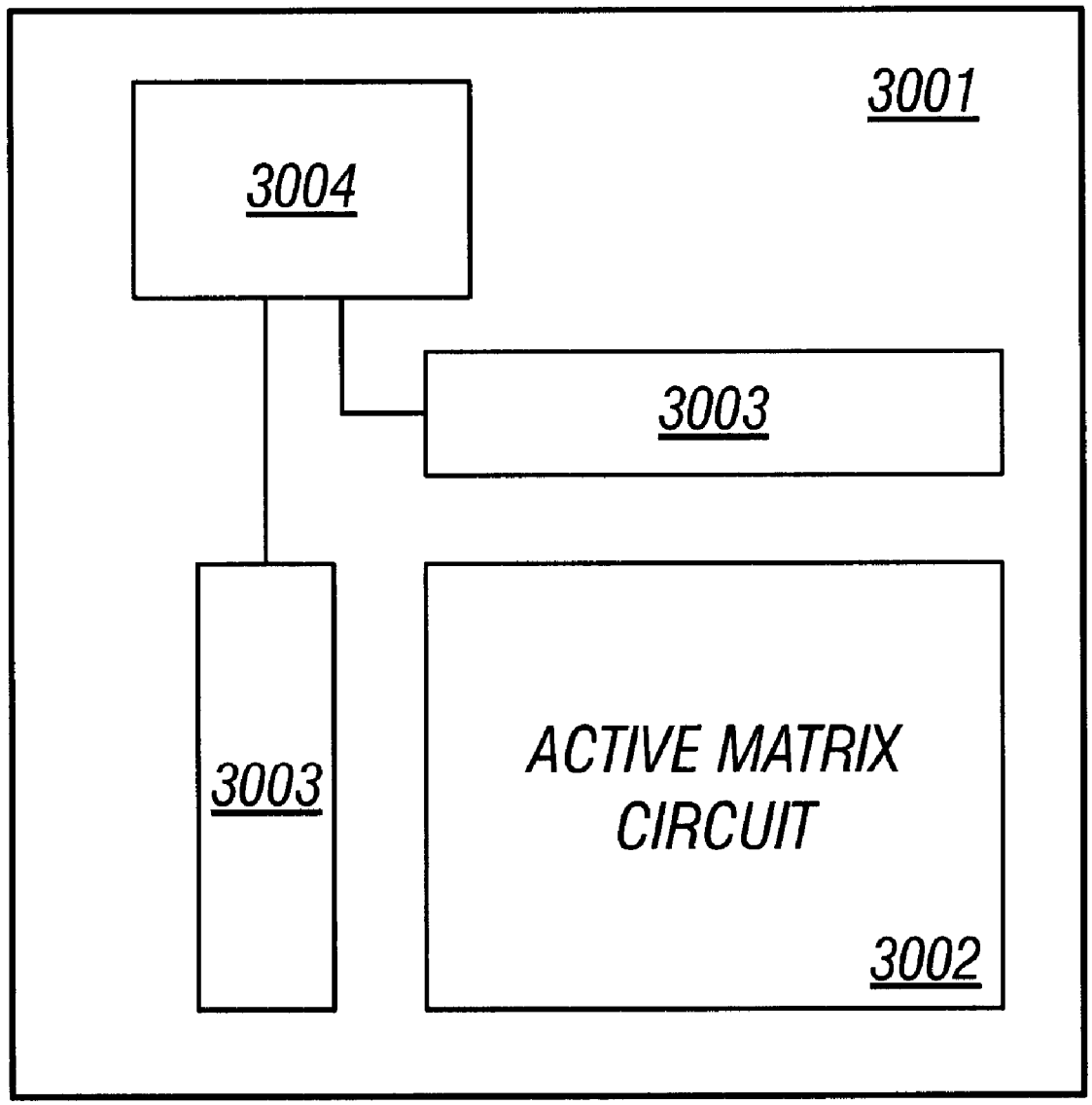
FIG. 20 shows an optical-electric device having a plurality of circuits comprising thin film transistors according to the invention.

This embodiment is directed to a case of constructing, by using the TFT of the first embodiment and the CMOS circuit of the second embodiment, an active matrix electro-optical device in which a pixel (active matrix) circuit 3002 and logic circuits are integrated on the same base member 3001 as shown in FIG. 20. Examples of the electro-optical device are a liquid crystal display device, an EL (electroluminescence) display device, and an EC (electrochrominance) display device.

The logic circuits mean integrated circuits for driving the electro-optical device, such as peripheral driver circuits 3003 and a control circuit 3004. While conventional active matrix electro-optical devices generally use externally provided ICs as the logic circuits because of a limited degree of integration and operation performance, all the circuits can be formed on the same substrate in an integral manner by using the TFT according to the invention.

The control circuit includes the other electric circuits necessary for driving the electro-optical device, such as a processor circuit, a memory circuit, a clock generation circuit, and an A/D (D/A) converter circuit. Naturally the memory circuit includes the SRAM circuit and the DRAM circuit described in the fifth embodiment. Also, SXGA standard and XGA standard products can be obtained using the present invention.

By utilizing the invention to implement the above configuration, logic circuits can be constructed by using TFTs whose performance is equivalent to that of MOSFETS formed on a single crystal.

Embodiment 7

This embodiment is directed to manufacture of a TFT having a structure different than in the first embodiment. This embodiment will be described with reference to FIGS. 17A–17D.

Figure 17A:
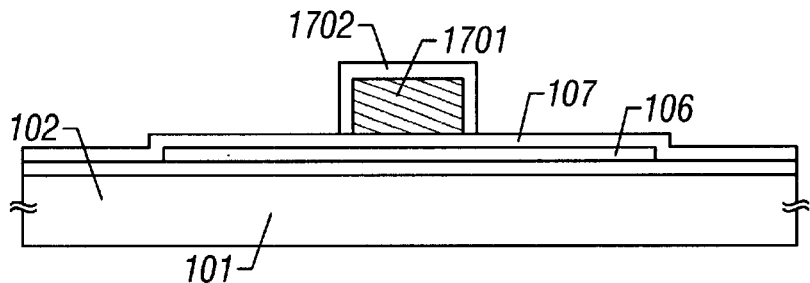
FIGS. 17A–17D show a manufacturing process according to a seventh embodiment of the invention.

First, the state of FIG. 1D is obtained by the same steps as in the first embodiment. In the state of FIG. 1D, a resist mask (not shown) that was used for the patterning of the aluminum film is removed and then a 1,000-Å-thick dense anodic oxide film 1702 is formed by performing anodization in tartaric acid. FIG. 17A shows this state.

In FIG. 17A, reference numeral 101 denotes a quartz substrate; 102, an underlayer film; 106, an active layer; and 107, a thermal oxidation film to later serve as a gate insulating film. Further, reference numeral 1701 denotes a gate electrode made of a material that includes aluminum as the main component, and 1702 denotes the above-mentioned dense anodic oxide film obtained by anodizing the gate electrode 1701.

Then, impurity ions for imparting one type of conductivity is implanted into the active layer 106. Impurity regions 1703 and 1704 are formed as a result of this ion implantation step.

After the implantation of impurity ions, a silicon nitride film 1705 of 0.5–1 μm in thickness is formed by low-pressure thermal CVD, plasma CVD, or sputtering. A silicon oxide film may be formed instead of the silicon nitride film.

Figure 17B:
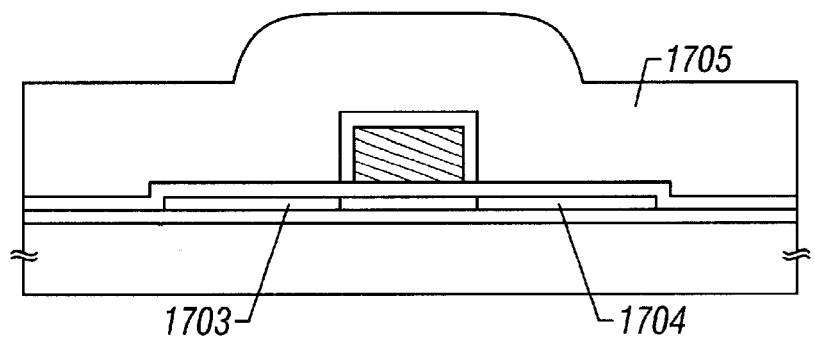

Thus, the state of FIG. 17B is obtained. In this state, the silicon nitride film 1705 is etched (etch back) so that it is left on only the side faces of the gate electrode 1701. The residual silicon nitride films serve as sidewalls 1706.

Figure 17C:
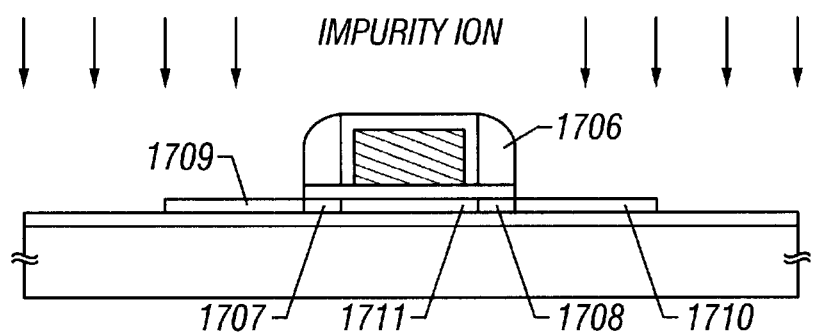

At this time, as shown in FIG. 17C, the portions of the thermal oxidation film 107 masked by the gate electrode remain and the other portions are removed.

In the state of FIG. 17C, impurity ions are again implanted at a higher dose than in the preceding ion implantation. In this ion implantation, ions are not implanted into regions 1707 and 1708 right under the sidewalls 1706 and hence the concentration of impurity ions does not vary there. On the other hand, impurity ions are further implanted into exposed regions 1709 and 1710 to increase the concentration there.

As a result of the two times of ion implantation, a source region 1709, a drain region 1710, and low-concentration impurity regions (or a LDD region) 1707 and 1708 having a lower impurity concentration than the source and drain regions 1709 and 1710 are formed. An undoped region right under the gate electrode 1701 becomes a channel forming region 1711.

After the state of FIG. 17C is obtained by the above steps, a 300-Å-thick titanium film (not shown) is formed and then caused to react with the silicon film (crystalline silicon film). After the titanium film is removed, a heat treatment such as lamp annealing is performed to form titanium silicide films 1712 and 1713 on the surfaces of the source region 1709 and the drain region 1710 (see FIG. 17D).

In the above step, a tantalum film, a tungsten film, a molybdenum film, or the like may be formed instead of the titanium film.

Figure 17D:
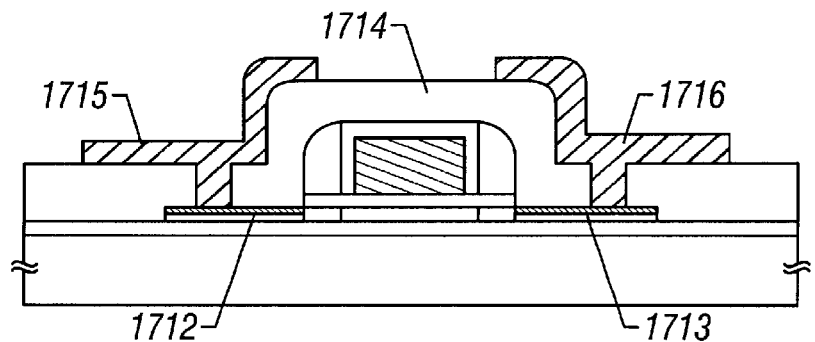

Then, after a 5,000-Å-thick silicon oxide film as an interlayer insulating film 1714 is formed, a source electrode 1715 and a drain electrode 1716 are formed. Thus, a TFT having a structure of FIG. 17D is completed.

The TFT having the structure of this embodiment has good ohmic contacts because the source and drain electrodes 1715 and 1716 are connected to the source and drain regions 1709 and 1710 via the titanium silicide films 1712 and 1713.

Embodiment 8

This embodiment is directed to manufacture of a TFT having a structure different than in the first and seventh embodiments. This embodiment will be described with reference to FIGS. 18A–18D.

Figure 18A:
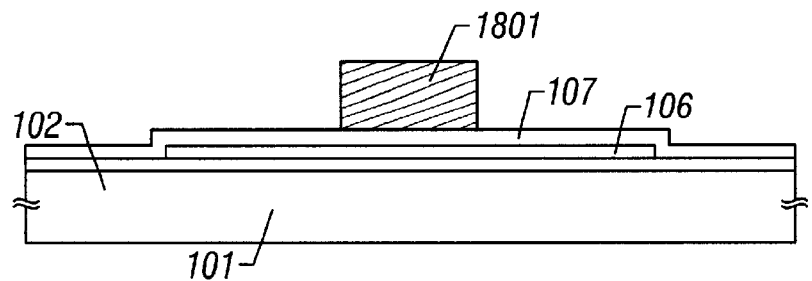
FIGS. 18A–18D show a manufacturing process according to an eighth embodiment of the invention.
Figure 18B:
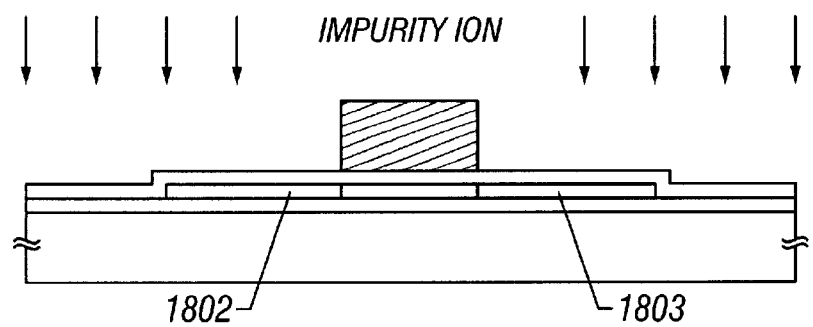

First, the state of FIG. 1D is obtained by the same steps as in the first embodiment except that in this embodiment a crystalline silicon film that is rendered conductive is used as a material of a gate electrode. FIG. 18A shows this state.

In FIG. 18A, reference numeral 101 denotes a quartz substrate; 102, an underlayer film; 106, an active layer; and 107, a thermal oxidation film to later serve as a gate insulating film. Further, reference numeral 1801 denotes a crystalline silicon film (polysilicon film) as a gate electrode.

Then, impurity ions for imparting one type of conductivity is implanted into the active layer 106. Impurity regions 1802 and 1803 are formed as a result of this ion implantation step (see FIG. 18B).

After the implantation of impurity ions, sidewalls 1804 are formed by a etch back method in the same manner as in the seventh embodiment.

After the formation of the sidewalls 1804, impurity ions are again implanted. As a result of the two times of ion implantation, a source region 1807, a drain region 1808, low-concentration impurity regions (or a LDD region) 1805 and 1806, and a channel forming region 1809 are formed.

Figure 18C:
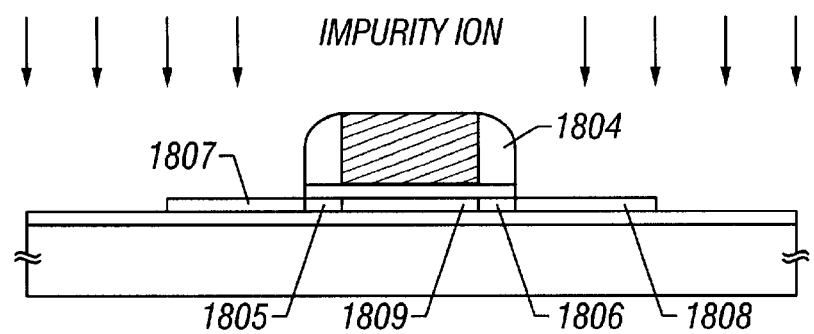

After the state of FIG. 18C is obtained by the above steps, a 500-Å-thick tungsten film (not shown) is formed and then caused to react with the silicon film. After the tungsten film is removed, a heat treatment such as lamp annealing is performed to form tungsten silicide films 1810–1812 on the surfaces of the gate electrode 1801, the source region 1807, and the drain region 1808 (see FIG. 18D).

Figure 18D:
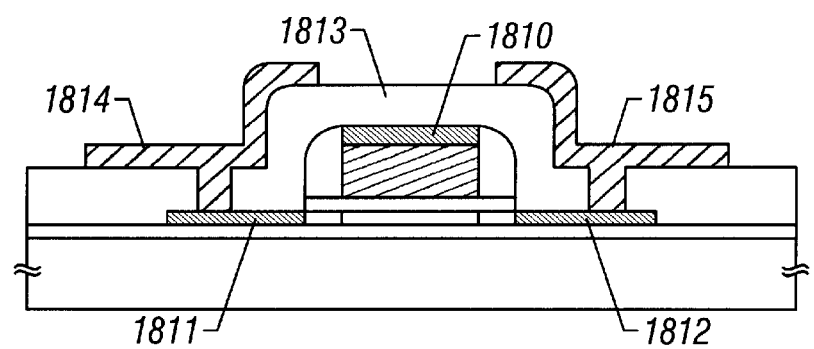

Then, after a 4,000-Å-thick silicon nitride film as an interlayer insulating film 1813 is formed, a source electrode 1814 and a drain electrode 1815 are formed. Thus, a TFT having a structure of FIG. 18D is completed.

The TFT having the structure of this embodiment has good ohmic contacts because the gate electrode 1801 and the source and drain electrodes 1807 and 1808 are connected to the lead-out electrodes via the tungsten silicide films 1810–1812.

Embodiment 9

This embodiment is directed to examples of electro-optical devices (display devices) that incorporate semiconductor devices according to the invention (e.g. FIG. 20). The electro-optical device may be used in the form of either a direct-view-type device or a projection-type device in accordance with its purpose. Since the electro-optical device is considered a device that operates on semiconductors, the term "electro-optical device" as used in this specification is included in the scope of the semiconductor device.

Application products of the semiconductor device according to the invention include a TV camera, a head-mounted display, a car navigation apparatus, a projection apparatus (a front type and a rear type), a video camera, and a personal computer. Examples of these application products will be described briefly with reference to FIGS. 19A–19F.

Figure 19A:
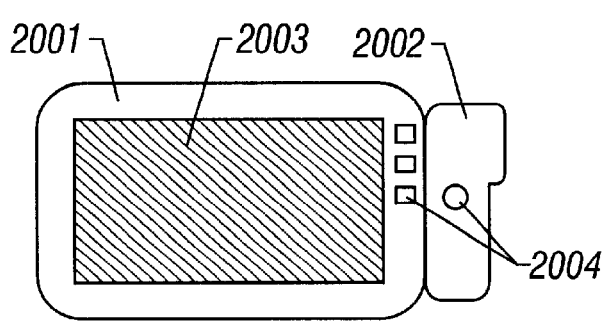
FIGS. 19A–19F show application products of semiconductor devices according to a ninth embodiment of the invention.

FIG. 19A shows a TV camera which consists of a main body 2001, a camera section 2002, a display device 2003, and manipulation switches 2004. The display device 2003 is used as a view finder.

Figure 19B:
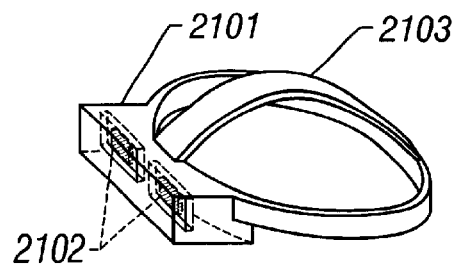

FIG. 19B shows a head-mounted display which consists of a main body 2101, two display devices 2102 of a relatively small size, and a band section 2103.

Figure 19C:
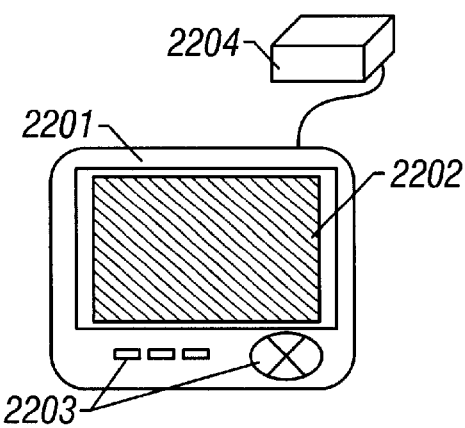

FIG. 19C shows a car navigation apparatus which consists of a main body 2201, a display device 2202, manipulation switches 2203, and an antenna 2204. Although the display device 2202 is used as a monitor, the allowable resolution range is relatively wide because its main purpose is display of a map.

Figure 19D:
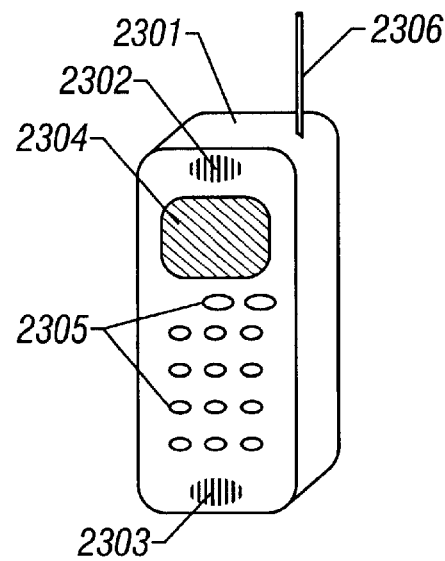

FIG. 19D shows a portable information terminal apparatus (in this embodiment, a cellular telephone) which consists of a main body 2301, a voice output section 2302, a voice input section 2303, a display device 2304, manipulation buttons 2305, and an antenna 2306. It is expected that in the future the display device 2303 will be required to display moving pictures to allow the cellular telephone to serve as a visual telephone.

Figure 19E:
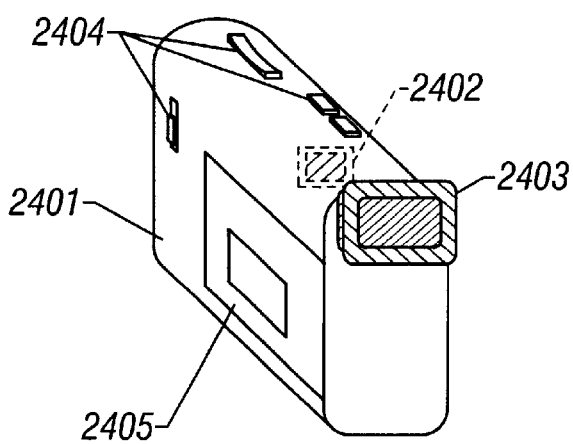

FIG. 19E shows a video camera which consists of a main body 2401, a display device 2402, an eyepiece unit 2403, manipulation switches 2404, and a tape holder 2405. An image being taken that is displayed on the display device 2402 can be viewed through the eyepiece unit 2403 on a real-time basis. Therefore, a user can take a picture while watching a displayed image.

Figure 19F:
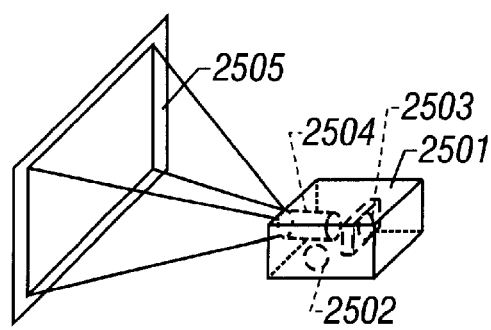

FIG. 19F shows a front projection apparatus which consists of a main body 2501, a light source 2502, a reflection-type display device 2503, an optical system (including a beam splitter, a polarizer, etc.) 2504, and a screen 2505. The display device 2503 is required to have high resolution because the screen 2505 is a large-size screen to be used for presentation in a conference or a meeting of a scientific society.

The application range of the semiconductor device according to the invention is not limited to the electro-optical devices of this embodiment, and it can also be applied to a rear projection apparatus and such portable information terminal apparatuses as a mobile computer and a handy terminal. As such, the application range of the invention is very wide; the invention can be applied to display media of every field.

The application range of the TFT according to the invention is not limited to the electro-optical device. For example, it may be incorporated in an integrated circuit in the form of an SRAM or a DRAM and may be used as a driver circuit of the application products described in this embodiment.

As described above, according to the invention, a TFT can be realized that has high performance equivalent to the performance of a MOSFET formed on single crystal silicon. Further, a ring oscillator constituted of TFTs according to the invention can operate 20 times faster than a ring oscillator constituted of conventional TFTs.

In spite of such high performance, the TFT according to the invention has a very high breakdown voltage even in such a fine structural range that the channel length is as short as less than 1 µm, which means that the short channel effect is prevented effectively.

By applying an integrated circuit that is constructed by using such TFTs to an electro-optical device, the performance of the electro-optical device can be improved further. In addition, application products of the electro-optical device can be given high performance and high added value.

Although the TFTS in the above-mentioned embodiments are described as top gate type TFTs, the present invention can be applied to bottom gate type TFTs and the application products can be also given high performance and high added value.

What is claimed is:

1. A semiconductor device comprising:
a substrate having an insulating surface;
a semiconductor film over the substrate;
a source region, a drain region, and a plurality of channel forming region formed in the semiconductor film; and
at least one region formed between the source region and the drain region in the semiconductor film, the region comprising oxide,
wherein the region comprising oxide divides between one of the channel forming regions and the next of channel forming regions, and
wherein each of the region comprising oxide and the channel forming regions extends along a direction connecting the source region and the drain region.

2. A device according to claim 1 further comprising a gate electrode adjacent to the semiconductor film with a gate insulating film interposed therebetween.

3. A device according to claim 1 wherein said semiconductor device having at least one dynamic random access memory.

4. A device according to claim 1 wherein said semiconductor device having at least one static random access memory.

5. A device according to claim 1 wherein said semiconductor device comprises an EL display device.

6. A device according to claim 1 wherein said semiconductor device is included in at least one electric device selected from the group consisting of a TV camera, a head-mounted display, a car navigation apparatus, a front type projection apparatus, a rear type projection apparatus, a video camera, and a personal computer, a portable information terminal apparatus, and a cellular telephone.

7. A semiconductor device having a plurality of thin film transistors, comprising:
a substrate having an insulating surface;
a semiconductor film over the substrate;
a source region, a drain region, and a plurality of channel forming region formed in the semiconductor film; and
at least one region formed between the source region and the drain region in the semiconductor film, the region comprising oxide,
wherein the region comprising oxide divides between one of the channel forming regions and the next of channel forming regions,
wherein each of the region comprising oxide and the channel forming regions extends along a direction connecting the source region and the drain region, and
wherein S-value of n-channel type thin film transistors is within 90±45 mV/dec and S-value of p-channel type thin film transistors is within 100±90 mV/dec.

8. A device according to claim 7 wherein standard deviation of mobility of n-channel type thin film transistors is 50 cm2/Vs or less and standard deviation of mobility of p-channel type thin film transistors is 20 cm2/Vs or less.

9. A device according to claim 7 further comprising a gate electrode adjacent to the semiconductor film with a gate insulating film interposed therebetween.

10. A device according to claim 7 wherein said semiconductor device having at least one dynamic random access memory.

11. A device according to claim 7 wherein said semiconductor device having at least one static random access memory.

12. A device according to claim 7 wherein said semiconductor device comprises an EL display device.

13. A device according to claim 7 wherein said semiconductor device is included in at least one electric device selected from the group consisting of a TV camera, a head-mounted display, a car navigation apparatus, a front type projection apparatus, a rear type projection apparatus, a video camera, and a personal computer, a portable information terminal apparatus, and a cellular telephone.

14. A semiconductor device having a plurality of thin film transistors, comprising:
a substrate having an insulating surface;
a semiconductor film over the substrate;
a source region, a drain region, and a plurality of channel forming region formed in the semiconductor film; and
at least one region formed between the source region and the drain-region in the semiconductor film, the region comprising oxide,
wherein the region comprising oxide divides between one of the channel forming regions and the next of channel forming regions, wherein each of the region comprising oxide and the channel forming regions extends along a direction connecting the source region and the drain region, and wherein standard deviation of S-value of n-channel type thin film transistors is 15 mV/dec or less and standard deviation of S-value of p-channel type thin film transistors is 30 mV/dec or less.

15. A device according to claim 14 wherein standard deviation of mobility of n-channel type thin film transistors is 50 cm2/Vs or less and standard deviation of mobility of p-channel type thin film transistors is 20 cm2/Vs or less.

16. A device according to claim 14 further comprising a gate electrode adjacent to the semiconductor film with a gate insulating film interposed therebetween.

17. A device according to claim 14 wherein said semiconductor device having at least one dynamic random access memory.

18. A device according to claim 14 wherein said semiconductor device having at least one static random access memory.

19. A device according to claim 14 wherein said semiconductor device comprises an EL display device.

20. A device according to claim 14 wherein said semiconductor device is included in at least one electric device selected from the group consisting of a TV camera, a head-mounted display, a car navigation apparatus, a front type projection apparatus, a rear type projection apparatus, a video camera, and a personal computer, a portable information terminal apparatus, and a cellular telephone.

21. A semiconductor device comprising:

a substrate having an insulating surface;

a semiconductor film over the substrate;

a source region, a drain region, and a plurality of channel forming region formed in the semiconductor film; and at least one region formed between the source region and the drain region in the semiconductor film, the region comprising oxide, wherein the region comprising oxide separates adjoining channel forming regions in the semiconductor film parallel to a channel length direction.

22. A device according to claim 21 further comprising a gate electrode adjacent to the semiconductor film with a gate insulating film interposed therebetween.

23. A device according to claim 21 wherein said semiconductor device having at least one dynamic random access memory.

24. A device according to claim 21 wherein said semiconductor device having at least one static random access memory.

25. A device according to claim 21 wherein said semiconductor device comprises an EL display device.

26. A device according to claim 21 wherein said semiconductor device is included in at least one electric device selected from the group consisting of a TV camera, a head-mounted display, a car navigation apparatus, a front type projection apparatus, a rear type projection apparatus, a video camera, and a personal computer, a portable information terminal apparatus, and a cellular telephone.

27. A semiconductor device having a plurality of thin film transistors, comprising:

a substrate having an insulating surface;

a semiconductor film over the substrate;

a source region, a drain region, and a plurality of channel forming region formed in the semiconductor film; and at least one region formed between the source region and the drain region in the semiconductor film, the region comprising oxide, wherein the region comprising oxide separates adjoining channel forming regions in the semiconductor film parallel to a channel length direction, and wherein S-value of n-channel type thin film transistors is within 90±45 mV/dec and S-value of p-channel type thin film transistors is within 100±90 mV/dec.

28. A device according to claim 27 wherein standard deviation of mobility of n-channel type thin film transistors is 50 cm2/Vs or less and standard deviation of mobility of p-channel type thin film transistors is 20 cm2/Vs or less.

29. A device according to claim 27 further comprising a gate electrode adjacent to the semiconductor film with a gate insulating film interposed therebetween.

30. A device according to claim 27 wherein said semiconductor device having at least one dynamic random access memory.

31. A device according to claim 27 wherein said semiconductor device having at least one static random access memory.

32. A device according to claim 27 wherein said semiconductor device comprises an EL display device.

33. A device according to claim 27 wherein said semiconductor device is included in at least one electric device selected from the group consisting of a TV camera, a head-mounted display, a car navigation apparatus, a front type projection apparatus, a rear type projection apparatus, a video camera, and a personal computer, a portable information terminal apparatus, and a cellular telephone.

34. A semiconductor device having a plurality of thin film transistors, comprising:

a substrate having an insulating surface;

a semiconductor film over the substrate;

a source region, a drain region, and a plurality of channel forming region formed in the semiconductor film; and at least one region formed between the source region and the drain region in the semiconductor film, the region comprising oxide, wherein the region comprising oxide separates adjoining channel forming regions in the semiconductor film parallel to a channel length direction, and wherein standard deviation of S-value of n-channel type thin film transistors is 15 mV/dec or less and standard deviation of S-value of p-channel type thin film transistors is 30 mV/dec or less.

35. A device according to claim 34 wherein standard deviation of mobility of n-channel type thin film transistors is 50 cm2/Vs or less and standard deviation of mobility of p-channel type thin film transistors is 20 cm2/Vs or less.

36. A device according to claim 34 further comprising a gate electrode adjacent to the semiconductor film with a gate insulating film interposed therebetween.

37. A device according to claim 34 wherein said semiconductor device having at least one dynamic random access memory.

38. A device according to claim 34 wherein said semiconductor device having at least one static random access memory.

39. A device according to claim 34 wherein said semiconductor device comprises an EL display device.

40. A device according to claim 34 wherein said semiconductor device is included in at least one electric device selected from the group consisting of a TV camera, a head-mounted display, a car navigation apparatus, a front type projection apparatus, a rear type projection apparatus, a video camera, and a personal computer, a portable information terminal apparatus, and a cellular telephone.

41. A semiconductor device comprising:
a substrate having an insulating surface;
a semiconductor film over the substrate;
a source region and a drain region formed in the semiconductor film; and
at least first and second channel forming regions formed in the semiconductor film, each of the channel forming regions extending between the source and drain regions wherein the first and second channel forming regions are electrically separated from one another by an oxide interposed therebetween.

42. A device according to claim 41 further comprising a gate electrode adjacent to the semiconductor film with a gate insulating film interposed therebetween.

43. A device according to claim 41 wherein said semiconductor device having at least one dynamic random access memory.

44. A device according to claim 41 wherein said semiconductor device having at least one static random access memory.

45. A device according to claim 41 wherein said semiconductor device comprises an EL display device.

46. A device according to claim 41 wherein said semiconductor device is included in at least one electric device selected from the group consisting of a TV camera, a head-mounted display, a car navigation apparatus, a front type projection apparatus, a rear type projection apparatus, a video camera, and a personal computer, a portable information terminal apparatus, and a cellular telephone.

47. A semiconductor device having a plurality of thin film transistors, comprising:
a substrate having an insulating surface;
a semiconductor film over the substrate;
a source region and a drain region formed in the semiconductor film; and
at least first and second channel forming regions formed in the semiconductor film, each of the channel forming regions extending between the source and drain regions wherein the first and second channel forming regions are electrically separated from one another by an oxide interposed therebetween, and
wherein S-value of n-channel type thin film transistors is within 90±45 mV/dec and S-value of the p-channel type thin film transistors is within 100±90 mV/dec.

48. A device according to claim 47 wherein standard deviation of mobility of n-channel type thin film transistors is 50 cm2/Vs or less and standard deviation of mobility of p-channel type thin film transistors is 20 cm2/Vs or less.

49. A device according to claim 47 further comprising a gate electrode adjacent to the semiconductor film with a gate insulating film interposed therebetween.

50. A device according to claim 47 wherein said semiconductor device having at least one dynamic random access memory.

51. A device according to claim 47 wherein said semiconductor device having at least one static random access memory.

52. A device according to claim 47 wherein said semiconductor device comprises an EL display device.

53. A device according to claim 47 wherein said semiconductor device is included in at least one electric device selected from the group consisting of a TV camera, a head-mounted display, a car navigation apparatus, a front type projection apparatus, a rear type projection apparatus, a video camera, and a personal computer, a portable information terminal apparatus, and a cellular telephone.

54. A semiconductor device having a plurality of thin film transistors, comprising:
a substrate having an insulating surface;
a semiconductor film over the substrate;
a source region and a drain region formed in the semiconductor film; and
at least first and second channel forming regions formed in the semiconductor film, each of the channel forming regions extending between the source and drain regions wherein the first and second channel forming regions are electrically separated from one another by an oxide interposed therebetween, and
wherein standard deviation of S-value of n-channel type thin film transistors is 15 mV/dec or less and standard deviation of S-value of p-channel type thin film transistors is 30 mV/dec or less.

55. A device according to claim 54 wherein standard deviation of mobility of n-channel type thin film transistors is 50 cm2/Vs or less and standard deviation of mobility of p-channel type thin film transistors is 20 cm2/Vs or less.

56. A device according to claim 54 further comprising a gate electrode adjacent to the semiconductor film with a gate insulating film interposed therebetween.

57. A device according to claim 54 wherein said semiconductor device having at least one dynamic random access memory.

58. A device according to claim 54 wherein said semiconductor device having at least one static random access memory.

59. A device according to claim 54 wherein said semiconductor device comprises an EL display device.

60. A device according to claim 54 wherein said semiconductor device is included in at least one electric device selected from the group consisting of a TV camera, a head-mounted display, a car navigation apparatus, a front type projection apparatus, a rear type projection apparatus, a video camera, and a personal computer, a portable information terminal apparatus, and a cellular telephone.

* * * * *